United States Patent [19]
Matsumoto et al.

[11] Patent Number: 6,100,170
[45] Date of Patent: Aug. 8, 2000

[54] METHOD OF MANUFACTURING SEMICONDUCTOR DEVICE

[75] Inventors: Michikazu Matsumoto, Kyoto; Tatsuo Sugiyama; Shinichi Ogawa, both of Osaka; Masato Kanazawa, Kyoto; Kouji Tamura; Masahiro Yasumi, both of Osaka, all of Japan

[73] Assignee: Matsushita Electronics Corporation, Osaka, Japan

[21] Appl. No.: 09/110,942

[22] Filed: Jul. 7, 1998

[30] Foreign Application Priority Data

Jul. 7, 1997 [JP] Japan ................................. 9-181038

[51] Int. Cl.[7] ........................ H01L 21/425; H01L 21/3205
[52] U.S. Cl. ............................................ 438/528; 438/592
[58] Field of Search ................................ 438/528, 592, 438/683

[56] References Cited

U.S. PATENT DOCUMENTS

| | | |
|---|---|---|
| 4,683,645 | 8/1987 | Naguib et al. . |
| 5,821,158 | 10/1998 | Shishiguchi .......................... 438/528 |
| 5,950,098 | 9/1999 | Oda et al. .............................. 438/527 |
| 5,960,319 | 9/1999 | Iwata et al. ........................... 438/664 |

FOREIGN PATENT DOCUMENTS

| | | |
|---|---|---|
| 7-161940 | 6/1985 | Japan . |
| 61-43464 | 3/1986 | Japan . |
| 63-133573 | 6/1988 | Japan . |
| 63-141349 | 6/1988 | Japan . |
| 63-261754 | 10/1988 | Japan . |
| 03209834 | 12/1991 | Japan . |
| 3-297148 | 12/1991 | Japan . |
| 05291180 | 5/1993 | Japan . |
| 5-211333 | 8/1993 | Japan . |

*Primary Examiner*—Richard Booth
*Attorney, Agent, or Firm*—McDermott, Will & Emery

[57] ABSTRACT

After forming a polysilicon film to be used as a gate electrode on a semiconductor substrate of silicon, an insulating thin film is deposited on the polysilicon film. Impurity ions are implanted into the polysilicon film through the insulating thin film, so as to form an amorphous layer on the surface of the polysilicon film. After removing the insulating thin film existing on the polysilicon film, a metal film is deposited on the amorphous layer. A reaction is caused between the amorphous layer and the metal film through annealing, so as to form a metal silicide layer on the surface of the polysilicon film.

9 Claims, 20 Drawing Sheets

METHOD OF MANUFACTURING SEMICONDUCTOR DEVICE

BACKGROUND OF THE INVENTION

The present invention relates to a method of manufacturing a semiconductor device, and more particularly, it relates to a method of manufacturing a semiconductor device in which the resistance of a gate electrode is decreased by forming a metal silicide layer on a polysilicon film to be used as the gate electrode.

In a manufacturing process for a semiconductor device, in particular, a VLSI, for the purpose of realizing a fine structure, a high packing density, a high operation speed and small power consumption, it is necessary to decrease the resistances of a gate electrode and a source/drain diffusion layer, a parasitic resistance and a parasitic capacitance.

As a measure for decreasing the resistances of a gate electrode and a source/drain diffusion layer, a silicide process for forming a silicide layer, that is, a compound of silicon and a metal, on the gate electrode and the source/drain diffusion layer is known.

Furthermore, in particularly a self aligned silicide (salicide) process, which is a kind of the silicide process, a metal silicide layer is simultaneously formed on a polysilicon film to be used as the gate electrode and on an impurity diffusion layer to be used as the source/drain region. Since the metal silicide layer can be formed on the polysilicon film to be used as the gate electrode and the impurity diffusion layer to be used as the source/drain region in one and the same step in this salicide process, the number of steps and a manufacturing cost can be both decreased. Owing to this advantage, the salicide process is regarded as a promising process required for the refinement of a semiconductor device, and is now variously studied.

However, in a $TiSi_2$ salicide process and a $CoSi_2$ salicide process, which are recently particularly in the spotlight among various kinds of the salicide process, a sheet resistance value is characteristically increased in accordance with the refinement in a line width of a gate electrode and a source/drain electrode. The increase of the sheet resistance value caused by the reduction of the line width is a significant problem, and therefore, there is a demand for a technique to suppress the increase of the sheet resistance value while reducing the line width.

As a method of suppressing the increase of a sheet resistance value derived from the reduction of a line width, Japanese Laid-Open Patent Publication Nos. 3-209834 and 5-291180 disclose a pre-amorphous process. In the pre-amorphous process, before depositing a metal film of Ti or Co on a polysilicon film to be used as a gate electrode and an impurity diffusion layer to be used as a source/drain region, the surfaces of the polysilicon film and the impurity diffusion layer are changed into amorphous by implanting impurity ions of As or the like into the polysilicon film and the impurity diffusion layer. As the impurity ion used in the pre-amorphous process, an ion of a comparatively heavy element with a small implantation depth, such as an As ion, is used, and the ion implantation for implanting the As ions is performed in the pre-amorphous process at a dose of approximately $3 \times 10^{14}/cm^{-2}$.

In adopting the pre-amorphous process in which amorphous layers are respectively formed on the polysilicon film and the impurity diffusion layer before depositing the metal film of Ti or Co, the problem occurring in the salicide process, namely, the increase of a sheet resistance value derived from the reduction of a line width can be suppressed.

In the case where the pre-amorphous process is not adopted, the sheet resistance value is vigorously increased generally when the line width is smaller than approximately 0.5 $\mu$m. In contrast, in adopting the pre-amorphous process, the sheet resistance value is not largely increased when the line width is decreased to approximately 0.3 $\mu$m.

When an implantation energy for the As ions is smaller than 15 KeV, an amorphous layer cannot be definitely formed on the polysilicon film to be used as the gate electrode and the impurity diffusion layer to be used as the source/drain region, and therefore, a metal silicide layer cannot be definitely formed. As a result, a line resistance of the gate electrode and the source/drain electrode cannot be decreased. Accordingly, in the salicide process, it is necessary to implant the impurity ions at the implantation energy of 20 KeV or more so as to form the amorphous layers on the polysilicon film and the impurity diffusion layer.

Now, a conventional method of manufacturing a semiconductor device including the salicide process will be described with reference to FIGS. 20(a) through 20(f).

First, as is shown in FIG. 20(a), on a semiconductor substrate 10 of silicon, an isolation region 11, a gate insulating film 12, a polysilicon film 13 to be used as a gate electrode, a low concentration impurity layer 14, a sidewall 15 and a high concentration impurity layer 16 to be used as a source/drain region are successively formed. Then, the high concentration impurity layer 16 is activated through a heat treatment. The resistance of the polysilicon film 13 is decreased by doping the film with impurity ions. The low concentration impurity layer 14 is an LDD diffusion layer formed for improving the initial characteristic and the reliability of a MOS transistor. Impurity ions are implanted into the high concentration impurity layer 16 by using the polysilicon film 13 and the sidewall 15 as masks.

Next, in order to decrease the sheet resistance of the gate electrode and the source/drain electrode as described above, As ions or the like are implanted into the surfaces of the polysilicon film 13 and the high concentration impurity layer 16, thereby forming an amorphous layer 17 as is shown in FIG. 20(b). Then, the surface of the substrate is cleaned with a hydrofluoride solution. Thereafter, a Ti film 18 with a thickness of, for example, approximately 40 nm is deposited on the entire surface of the semiconductor substrate 10 as is shown in FIG. 20(c).

Then, first annealing is conducted by the rapid thermal annealing (RTA) at a temperature of approximately 650° C. in an atmosphere of nitrogen, so as to cause a reaction between the amorphous layer 17 and the Ti film 18. Thus, a $TiSi_2$ (C49) film 19 having a crystalline structure designated as C49 is formed on the polysilicon film 13 and the high concentration impurity layer 16 as is shown in FIG. 20(d). In this case, since the first annealing is conducted at a temperature of approximately 650° C., the $TiSi_2$ (C49) film 19 is formed as a phase having a high resistance of approximately 10 through 20 $\Omega/\square$ (that is, a phase of the C49 structure). Furthermore, since a portion of the Ti film 18 above the isolation region 11 and the sidewall 15 is not in contact with the silicon layer, the silicidation is not proceeded in such a portion, and hence, the Ti film 18 in such a portion becomes a TiN film or remains as an unreacted Ti film.

Next, as is shown in FIG. 20(e), the Ti film 18 above the isolation region 11 and the sidewall 15 is selectively removed by using an etching solution such as sulfuric acid—hydrogen peroxide and ammonia—hydrogen peroxide. Then, second annealing is performed for a short period of time by the RTA at a temperature of approximately 800° C. through 850° C. in an atmosphere of nitrogen. Thus, as is shown in FIG. 20(f), the TiSi$_2$ (C49) film 19 is changed into a low-resistance TiSi$_2$ (C54) film 20 having a crystalline structure designated as C54.

Subsequently, although not shown in the drawings, an interlevel insulating film is deposited on the entire surface of the semiconductor substrate 10, and the interlevel insulating film is planarized. Then, a contact hole is formed in the planarized interlevel insulating film and a metal line is formed. In this manner, a conventional semiconductor device is manufactured.

The aforementioned conventional method of manufacturing a semiconductor device has, however, the following problem: In order to suppress the disadvantage peculiar to the salicide process, namely, the increase of a sheet resistance derived from the reduction of a line width, the amorphous layer 17 is formed on the polysilicon film 13 to be used as the gate electrode through the impurity ion implantation. However, depending upon a grain state of silicon crystal of the polysilicon film 13, a phenomenon in which an implanted As ion passes through the grain of the silicon crystal of the polysilicon film 13 as is shown in FIG. 21 (that is, a channeling phenomenon) can be caused. When the silicon crystal of the polysilicon film 13 has a large grain diameter, the degree of the occurrence of the channeling phenomenon is increased, and when the implantation energy for the As ions is large, the degree of the occurrence of the channeling phenomenon is also increased.

FIG. 22 shows a transistor characteristic (Vg-Id characteristic) attained when the amorphous layer 17 is formed by implanting the As ions into the polysilicon film 13 having the grain state as is shown in FIG. 21 with the implantation energy varied. As described above, when the As ions are implanted at the implantation energy smaller than 20 KeV, the resistance of the gate electrode cannot be decreased. When the As ions are implanted at the implantation energy exceeding 20 KeV, the channeling phenomenon can occur in the gate electrode at the rate of one to several thousand or several ten thousand. Accordingly, as is shown in FIG. 22, an off-current flowing through a parallel connection of several ten thousand transistors is increased and the off-current value is fluctuated. When the off-current is increased, the power consumption of the entire VLSI is disadvantageously increased, and when the off-current value is fluctuated, the transistor characteristic is disadvantageously dispersed.

FIG. 23 shows a Vg-S parameter (swing) characteristic attained by a parallel connection of several ten thousand MOS transistors each manufactured by implanting the As ions at a dose of 3×10$^{14}$ cm$^{-2}$ with the implantation energy varied. In other words, the graph of FIG. 23 is obtained by plotting the inclination of the Vg-Id characteristic shown in FIG. 22 at every gate voltage Vg. As is obvious from FIG. 23, when the As ions are implanted at the energy of 20 KeV or more, the channeling phenomenon is caused, resulting in increasing the swing value. In a practical range of the gate voltage Vg, namely, in a region of the gate voltage Vg of 0.4 V or less, when the swing value largely exceeds 80, a leakage current is increased. In FIGS. 22 and 23, a region circled with a dashed line corresponds to a region where the characteristic of the MOS transistor is degraded due to the channeling phenomenon so as to cause a problem in the device performance.

FIG. 24 shows the Vg-Id characteristic of a MOS transistor attained in the case where the channeling phenomenon occurs (shown with a solid line) and in an ideal case (shown with a broken line). When the channeling phenomenon occurs, the Vg-Id characteristic of one MOS transistor is obtained by synthesizing a Vg-Id characteristic of a transistor component Tr1 in a region where the channeling phenomenon does not occur and a Vg-Id characteristic of a transistor component Tr2 in a region where the channeling phenomenon occurs. Therefore, as is shown with the solid line in FIG. 24, a kink phenomenon occurs in the Vg-Id characteristic. When the kink phenomenon occurs in the Vg-Id characteristic, the leakage current is unavoidably increased.

SUMMARY OF THE INVENTION

In view of the aforementioned conventional problems, the object of the invention is preventing the occurrence of a channeling phenomenon in a polysilicon film while decreasing the resistance of a gate electrode by forming an amorphous layer on the polysilicon film to be used as the gate electrode through ion implantation conducted at an implantation energy of 20 KeV or more.

In order to achieve the object, impurity ions for forming the amorphous layer on the polysilicon film to be used as the gate electrode are implanted through an insulating thin film in this invention.

Specifically, the method of manufacturing a semiconductor device of this invention comprises a polysilicon film forming step of forming a polysilicon film to be used as a gate electrode on a semiconductor substrate of silicon; an insulating thin film depositing step of depositing an insulating thin film on the polysilicon film; an ion implanting step of forming an amorphous layer on a surface of the polysilicon film by implanting impurity ions into the polysilicon film through the insulating thin film; an insulating thin film removing step of removing the insulating thin film existing on the polysilicon film; and a silicide layer forming step of forming a metal silicide layer on the surface of the polysilicon film by depositing a metal film on the amorphous layer and causing a reaction between the amorphous layer and the metal film through annealing.

According to the method of manufacturing a semiconductor device of this invention, after depositing the insulating thin film on the polysilicon film to be used as the gate electrode, the impurity ions are implanted into the polysilicon film through the insulating thin film. Therefore, the implanted impurity ions are dispersed within the insulating thin film and reach the surface of the polysilicon film with the energy reduced. Accordingly, the channeling phenomenon where the impurity ions pass through the polysilicon film can be definitely prevented. As a result, even through the amorphous layer is formed on the polysilicon film to be used as the gate electrode by implanting the impurity ions at a large implantation energy of, for example, 20 KeV or more, so as to decrease the resistance of the gate electrode, the occurrence of the channeling phenomenon in the polysilicon film can be definitely prevented.

In the method of manufacturing a semiconductor device, the ion implanting step preferably includes a step of implanting the impurity ions under a condition satisfying R$_p$-T>3 nm, wherein R$_p$ indicates a range of the impurity ions from a surface of the insulating thin film and T indicates a thickness of the insulating thin film.

In this manner, it is possible to attain a given relationship between the value of R$_p$-T and the sheet resistance of the gate electrode, resulting in attaining a stable sheet resistance.

In the method of manufacturing a semiconductor device, the insulating thin film removing step preferably includes a step of removing the insulating thin film existing on a silicide region to be silicidaion on the semiconductor substrate with allowing the insulating thin film existing on a non-silicide region not to be silicidation on the semiconductor substrate to remain.

In this manner, the insulating thin film can be used as a silicidation preventing film required for forming the non-silicide region, and hence, the number of steps can be reduced.

In the method of manufacturing a semiconductor substrate, the insulating thin film depositing step preferably includes a step of depositing the insulating thin film on an impurity diffusion layer formed on the semiconductor substrate to be used as a source/drain region, the ion implanting step preferably includes a step of forming an amorphous layer on a surface of the impurity diffusion layer by implanting the impurity ions into the impurity diffusion layer through the insulating thin film, and the silicide layer forming step preferably includes a step of forming a metal silicide layer to be used as a source/drain electrode on a surface of the impurity diffusion layer through annealing after depositing the metal film also on the amorphous layer formed on the surface of the impurity diffusion layer.

In this manner, the occurrence of the channeling phenomenon in the impurity diffusion layer to be used as the source/drain region can be prevented.

Preferably, the method of manufacturing a semiconductor device further comprises, between the insulating thin film depositing step and the ion implanting step, a step of activating an impurity diffusion layer formed on the semiconductor substrate to be used as a source/drain region through a heat treatment.

Thus, the impurity diffusion layer can be activated with the insulating thin film deposited on the impurity diffusion layer to be used as the source/drain region. In other words, the impurity diffusion layer is not bared in the heat treatment for the activation. Accordingly, it is possible to prevent a silicon nitride film or the like from being formed on the surface of the impurity diffusion layer through a reaction between the impurity diffusion layer and an atmosphere gas such as a nitrogen gas used in the heat treatment.

Preferably, the method of manufacturing a semiconductor device further comprises, between the insulating thin film depositing step and the ion implanting step, a step of forming an impurity diffusion layer to be used as a source/drain region by implanting impurity ions into the semiconductor substrate; and a step of activating the impurity diffusion layer through a heat treatment.

In this manner, the occurrence of the channeling phenomenon where the impurity ions pass through the impurity diffusion layer can be prevented in forming the impurity diffusion layer through implantation of the impurity ions. In addition, it is possible to prevent a nitride film or the like from being formed on the impurity diffusion layer through a reaction between the impurity diffusion layer and an atmosphere gas such as a nitrogen gas used in the heat treatment.

Preferably, the method of manufacturing a semiconductor device further comprises, between the insulating thin film depositing step and the ion implanting step, a step of forming a resist pattern on a non-silicide region not to be silicidation on the semiconductor substrate, and the insulating thin film removing step preferably includes a step of removing the insulating thin film existing on a silicide region to be silicidation on the semiconductor substrate, with allowing the insulating thin film existing on the non-silicide region to remain, by etching the insulating thin film with the resist pattern used as a mask.

In this manner, the impurity ions for forming the amorphous layer can be prevented from being implanted into the non-silicide region by the resist pattern. Accordingly, it is possible to prevent the amount of impurity in a resistance or the like to be formed in the non-silicide region from becoming unstable, which can otherwise make the resistance value of the resistance unstable.

In the method of manufacturing a semiconductor device, the insulating thin film deposited in the insulating thin film depositing step preferably has a thickness ranging between 5 nm and 50 nm.

In this manner, the amorphous layer can be definitely formed on the surface of the polysilicon film to be used as the gate electrode without causing the channeling phenomenon.

In the method of manufacturing a semiconductor device, the impurity ions implanted in the ion implanting step are preferably As ions, Ge ions, Si ions, P ions or $BF_2$ ions.

In this manner, the amorphous layer can be definitely formed on the polysilicon film.

In the method of manufacturing a semiconductor device, the metal film deposited in the silicide layer forming step is preferably a Ti film, a Co film, a Ni film or a Pt film.

In this manner, metal silicide can be definitely formed on the polysilicon film.

DETAILED DESCRIPTION OF THE INVENTION

EMBODIMENT 1

Figure 1:
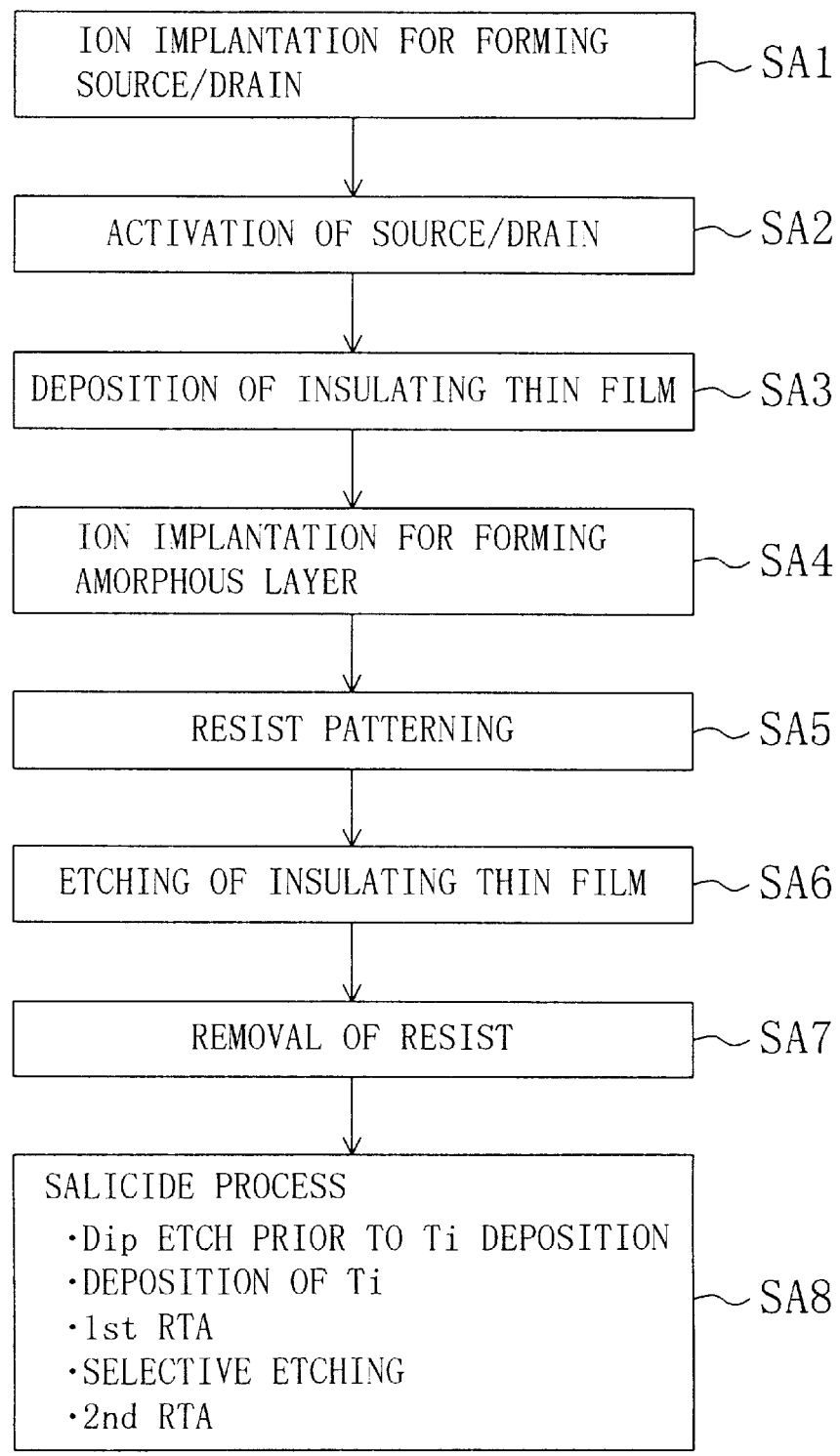
FIG. 1 is a flowchart of a method of manufacturing a semiconductor device according to a first embodiment of the invention.

A method of manufacturing a semiconductor device according to a first embodiment of the invention will now be described with reference to a flowchart of FIG. 1 and procedure sectional views of FIGS. 2(a) through 2(d) and 3(a) through 3(e).

Figure 2A:
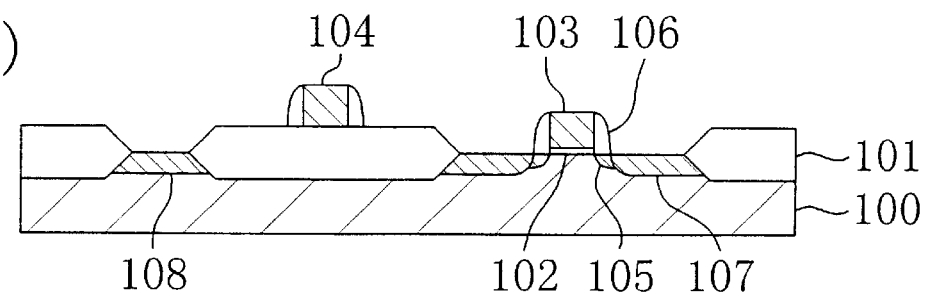
FIGS. 2(a) through 2(d) are sectional views for showing procedures in the method of manufacturing a semiconductor device of the first embodiment.

First, as is shown in FIG. 2(a), after an isolation region 101 and a gate insulating film 102 are formed on a semiconductor substrate 100 of silicon, a first polysilicon film 103 to be used as a gate electrode and a second polysilicon film 104 to be used as a first resistance are formed. The first and second polysilicon films 103 and 104 are doped with phosphorus as an impurity, and have a grain size of approximately 0.3 $\mu$m and a thickness of 330 nm. Subsequently, after forming a low concentration impurity layer 105 as an LDD diffusion layer and a sidewall 106, impurity ions are implanted by using the first polysilicon film 103 and the sidewall 106 as masks in a step SA1, thereby forming a first high concentration impurity layer 107 to be used as a source/drain region. At this point, a second high concentration impurity layer 108 to be used as a second resistance is simultaneously formed.

Next, in a step SA2, the semiconductor substrate 100 is subjected to a heat treatment at a temperature of approximately 850° C. in an atmosphere of nitrogen for 45 minutes, thereby activating the first high concentration impurity layer 107 to be used as the source/drain region and the second high concentration impurity layer 108 to be used as the second resistance.

Figure 2B:
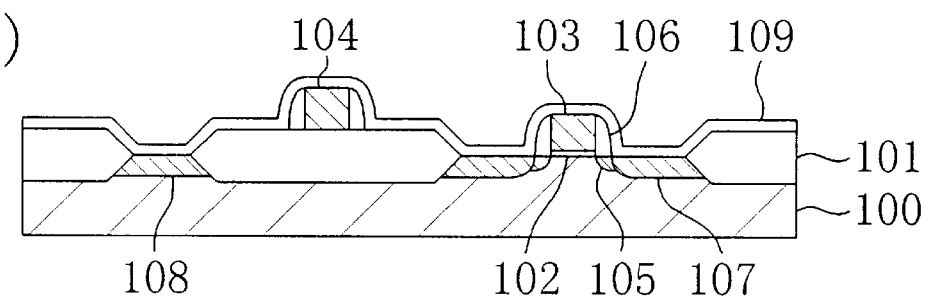

Then, in a step SA3, an insulating thin film 109 of a silicon oxide film with a thickness of 30 nm is deposited on the entire surface of the semiconductor substrate 100 by CVD (TEOS decomposition CVD) as is shown in FIG. 2(b).

Figure 2C:
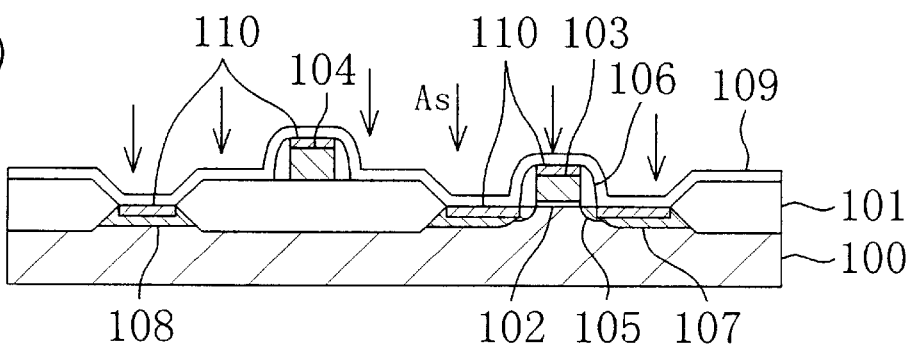

Then, in a step SA4, for example, As ions are implanted at a dose of $3 \times 10^{14}$ cm at an implantation energy of 60 KeV, thereby forming an amorphous layer 110 on the surfaces of the first and second polysilicon films 103 and 104 and the first and second high concentration impurity layers 107 and 108 as is shown in FIG. 2(c). At this point, a range ($R_p$) of the As ions implanted at the implantation energy of 60 KeV into the first and second polysilicon films 103 and 104 is 37.4 nm, and the insulating thin film 109 has a thickness of 30 nm. Therefore, the As ions are implanted into a depth of approximately 7.4 nm from the interface between the insulating thin film 109 and the first and second polysilicon films 103 and 104, whereby the amorphous layer 110 is formed.

Figure 2D:
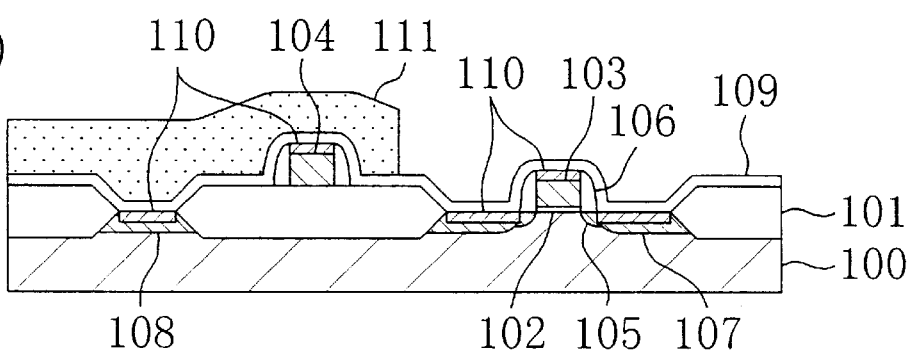

Next, in a step SA5, a resist pattern 111 is formed on a non-silicide region where no silicide layer is formed (i.e., a region where a MOS transistor is not formed but the first and second resistances are formed) as is shown in FIG. 2(d).

Figure 3A:
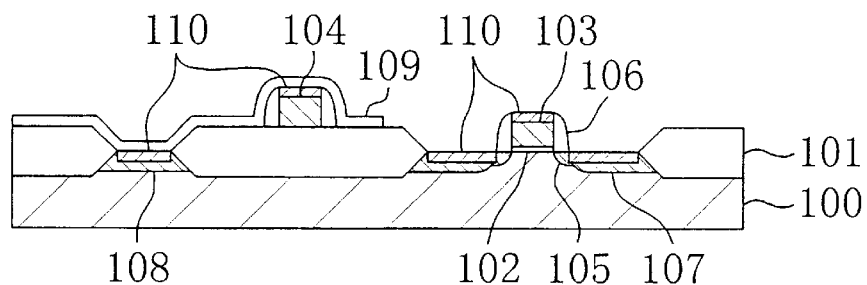
FIGS. 3(a) through 3(e) are sectional views for showing other procedures in the method of manufacturing a semiconductor device of the first embodiment.

Next, in a step SA6, the insulating thin film 109 is dry etched with an etching gas of a mixed gas including NH$_4$F and HF (20:1) for 30 seconds by using the resist pattern 111 as a mask. Thus, as is shown in FIG. 3(a), the insulating thin film 109 is selectively removed in a silicide region (i.e., a region where the MOS transistor is formed) with remaining in the non-silicide region. In this dry etching, approximately 50% over-etching is performed. Thereafter, in a step SA7, the resist pattern 111 is removed by using sulfuric acid—hydrogen peroxide.

Then, in a step SA8, a salicide process is conducted, which will be described with reference to FIGS. 3(b) through 3(e).

Figure 3B:
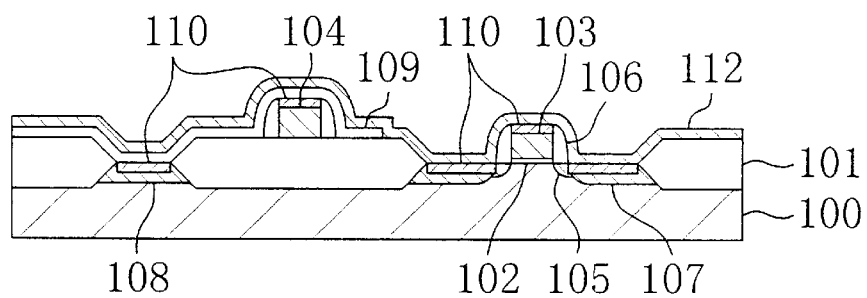

First, since a natural oxide film remains in a state where the resist pattern 111 is merely removed, the substrate is cleaned with a diluted HF solution (H$_2$O:HF=100:1) for 10 seconds (which procedures is designated as dip etch prior to Ti deposition). Then, a Ti film 112 with a thickness of 40 nm is deposited by sputtering on the entire surface of the semiconductor substrate 100 as is shown in FIG. 3(b).

Figure 3C:
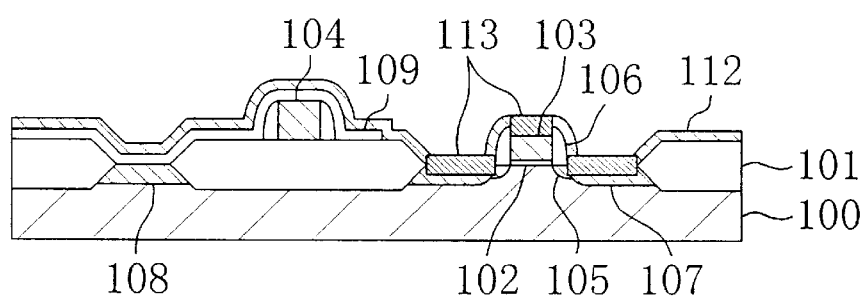

Next, first annealing is conducted at a temperature of approximately 650° C. for 30 seconds in an atmosphere of nitrogen by the RTA (which procedure is designated as first RTA), thereby causing a reaction between the amorphous layer 110 and the Ti film 112 in the silicide region. Thus, as is shown in FIG. 3(c), a TiSi$_2$ (C49) film 113 having the C49 crystalline structure is formed on the surfaces of the first polysilicon film 103 and the first high concentration impurity layer 107. In this case, since the first RTA is conducted at a temperature approximately 650° C., the TiSi$_2$ (C49) film 113 is formed as a phase having a high resistance of approximately 10 through 20 Ω/□ (i.e., a phase of the C49 structure). Furthermore, in the non-silicide region, the amorphous layer 110 is changed into polysilicon through the annealing, and in a part of the silicide region where the isolation region 101 and the sidewall 106 are formed and in a part of the non-silicide region where the insulating thin film 109 remains, the Ti film 112 is changed into a TiN film or remains unreacted because the silicidation is not proceeded in such regions.

Figure 3D:
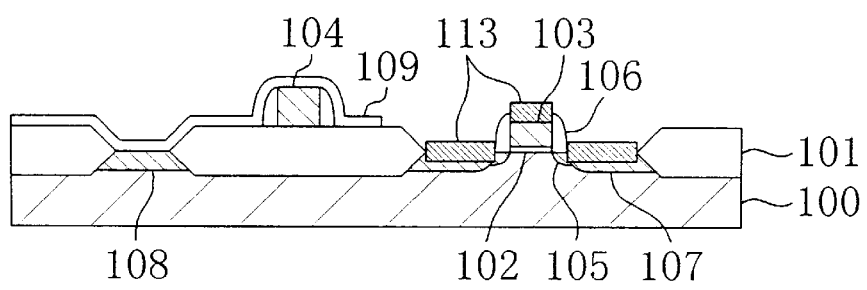
Figure 3E:
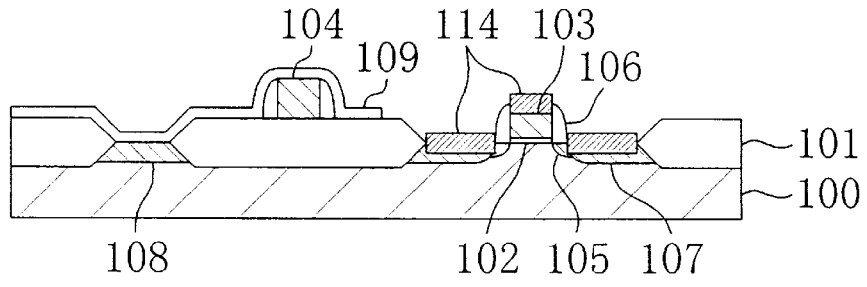

Then, as is shown in FIG. 3(d), the remaining Ti film 112 is selectively removed by using an etching solution such as sulfuric acid—hydrogen peroxide and ammonia—hydrogen peroxide. Thereafter, second annealing is conducted at a temperature of approximately 825° C. for 10 seconds in an atmosphere of nitrogen by the RTA (which procedure is designated as second RTA). As a result, the TiSi$_2$ (C49) film 113 is changed into a low-resistance TiSi$_2$(C54) film 114 having the C54 crystalline structure as is shown in FIG. 3(e). In this manner, the gate electrode is formed out of the first polysilicon film 103 and the TiSi$_2$ (C54) film 114, and a source/drain electrode is formed out of the TiSi$_2$ (C54) film 114 on the first high concentration impurity layer 107.

Subsequently, although not shown in the drawings, an interlevel insulating film is deposited on the entire surface of the semiconductor substrate 100, the interlevel insulating film is planarized, a contact hole is formed in the planarized interlevel insulating film, and a metallic line is formed. In this manner, a semiconductor device can be manufactured.

Figure 4:
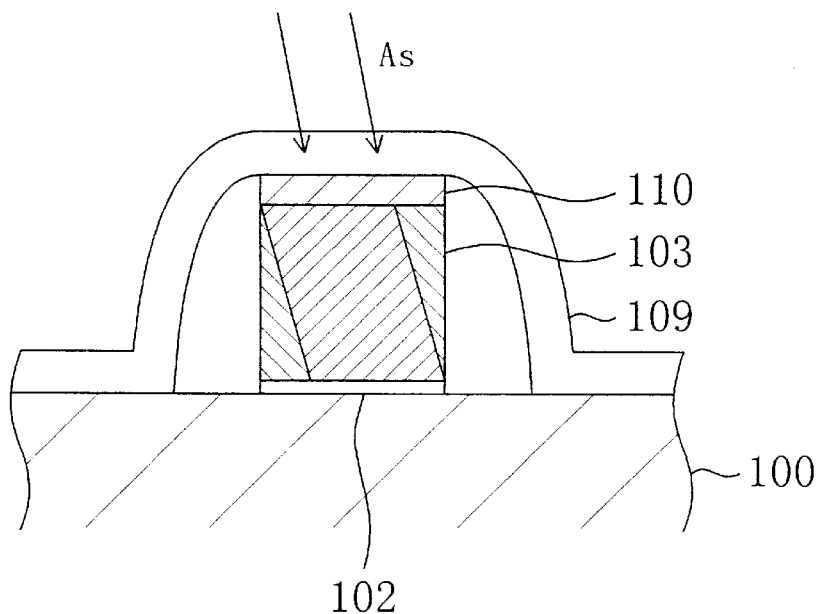
FIG. 4 is a sectional view for schematically showing formation of an amorphous layer by implanting As ions into a first polysilicon film through an insulating thin film in the method of manufacturing a semiconductor device of the first embodiment, for illustrating a state where a channeling phenomenon is not caused.

FIG. 4 is a sectional view for schematically showing formation of the amorphous layer 110 by implanting the As ions into the first polysilicon film 103 through the insulating thin film 109. Since the insulating thin film 109 with a thickness of 30 nm has the amorphous structure, the implanted As ions are diffused within the insulating thin film 109, and hence, the channeling phenomenon of the As ions can be definitely prevented. Furthermore, since the As ions are implanted at a large implantation energy of 60 KeV, the sheet resistance of the gate electrode and the source/drain electrode can be largely decreased.

Now, results of evaluation of the method of manufacturing a semiconductor device of the first embodiment will be described.

Figure 5:
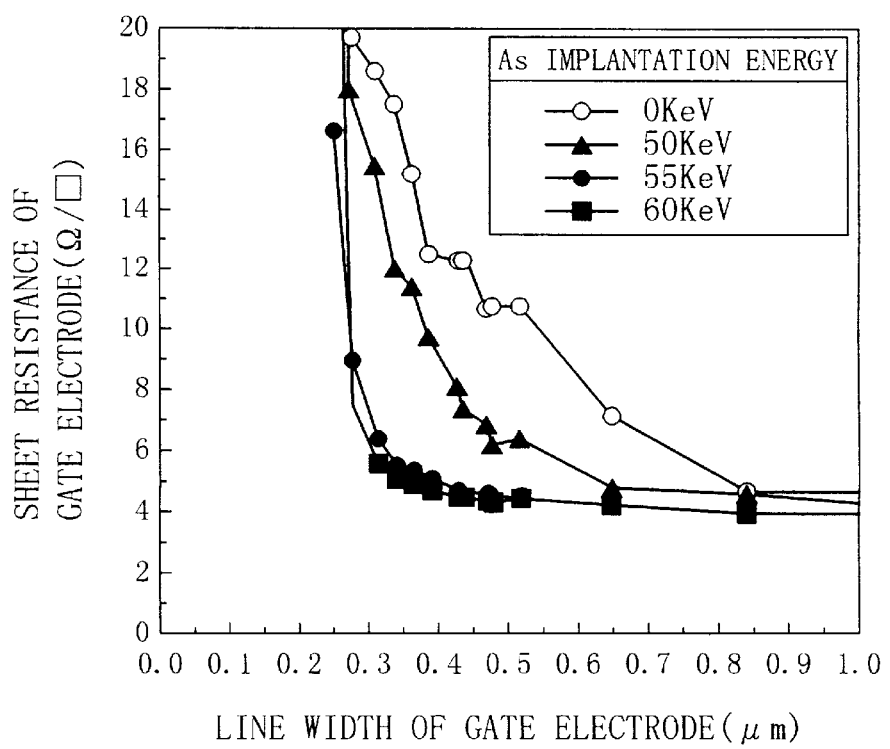
FIG. 5 is a graph for showing a relationship between a line width of a gate electrode and a sheet resistance attained when As ions are implanted with an implantation energy varied in the method of manufacturing a semiconductor device of the first embodiment.

FIG. 5 shows a relationship between the line width and the sheet resistance (an average+3σ, wherein σ is a standard deviation) of a gate electrode obtained when the As ions are not implanted (shown as an implantation energy of 0 KeV), or when the amorphous layer 110 is formed by ion implantation through the insulating thin film 109 with a thickness of 30 nm at an implantation energy of 50 KeV, 55 KeV or 60 KeV. As is obvious from FIG. 5, the increase of the sheet resistance derived from the reduction of the line width can be suppressed by the method of the first embodiment. In addition, when the ion implantation is conducted at an energy of 55 KeV or 60 KeV, a low sheet resistance with less fluctuation can be attained in a region of the line width of the gate electrode exceeding 0.3 μm.

The effect of suppressing the increase of the sheet resistance attained by forming the amorphous layer 110 on the surfaces of the first and second polysilicon films 103 and 104 by implanting the As ions through the insulating thin film 109 depends upon the thickness T of the insulating thin film 109 and the implantation energy for the As ions.

Figure 6:
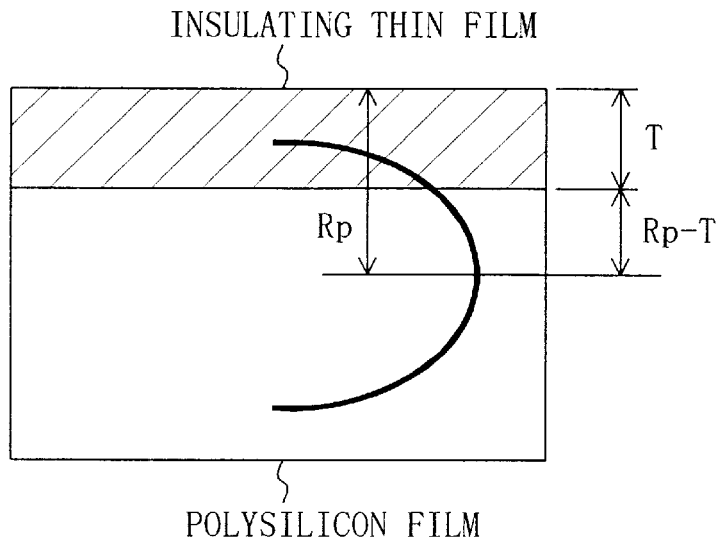
FIG. 6 is a schematic diagram for showing a concentration distribution of the As ions in the polysilicon film obtained in the method of manufacturing a semiconductor device of the first embodiment.

FIG. 6 schematically shows a concentration distribution (shown with a thick line) of the As ions in the insulating thin film and the polysilicon film. FIG. 6 illustrates the meaning of an implantation depth ($R_p$-T) from the surface of the polysilicon film obtained by subtracting the thickness T of the insulating thin film 109 from the range $R_p$ of the As ions.

Figure 7:
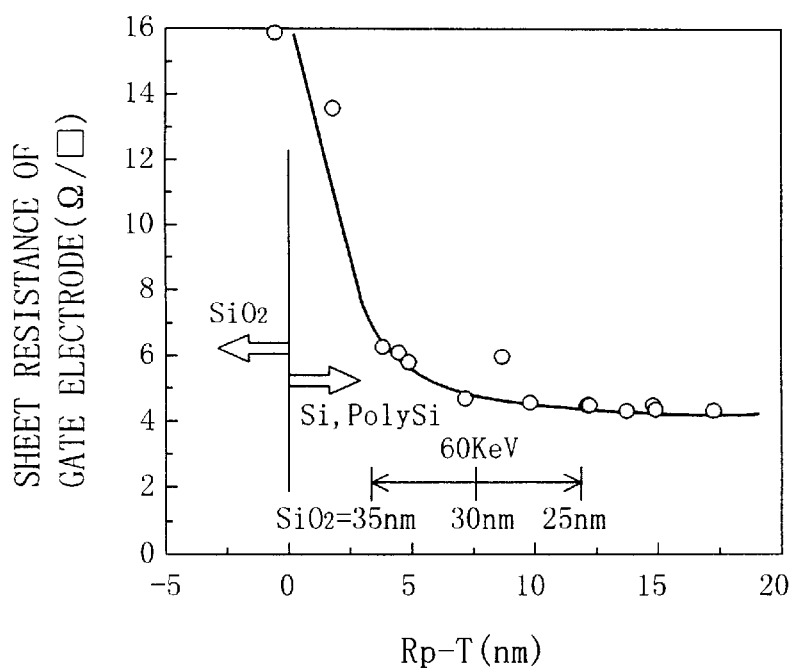
FIG. 7 is a graph for showing a relationship between an implantation depth from the surface of the polysilicon film ($R_p$-T) and the sheet resistance of a gate electrode attained when the implantation depth from the surface of the polysilicon film ($R_p$-T) is varied by changing a film thickness of the insulating thin film and the implantation energy in the method of manufacturing a semiconductor device of the first embodiment.

FIG. 7 shows a relationship between the implantation depth ($R_p$-T) from the surface of the polysilicon film and the sheet resistance (an average +3σ) of a gate electrode with a line width of 0.38 μm obtained when the implantation depth ($R_p$-T) from the surface of the polysilicon film is varied by changing the thickness of the insulating thin film 109 among 25 nm, 30 nm and 35 nm and changing the implantation energy in a range from 55 KeV to 70 KeV. As is obvious from FIG. 7, when the implantation depth ($R_p$-T) from the surface of the polysilicon film is 3 nm or more, there is a constant relationship between the implantation depth ($R_p$-T) from the surface of the polysilicon film and the sheet resistance of the gate electrode. Accordingly, when the implantation depth ($R_p$-T) from the surface of the polysilicon film is set at approximately 3 nm or more, a stable sheet resistance can be attained.

The thickness of the insulating thin film 109 is preferably in a range between 5 nm and 50 nm for the following reason: When the insulating thin film 109 has a thickness smaller than 5 nm, the effect to prevent the channeling phenomenon can be scarcely attained. When the insulating thin film 109 has a thickness larger than 50 nm, the implantation depth ($R_p$-T) from the surface of the polysilicon film is so small that a stable sheet resistance cannot be attained.

Furthermore, when the implantation energy is 60 KeV, the insulating thin (SiO$_2$) film 109 preferably has a thickness ranging between 25 nm and 35 nm.

Figure 8:
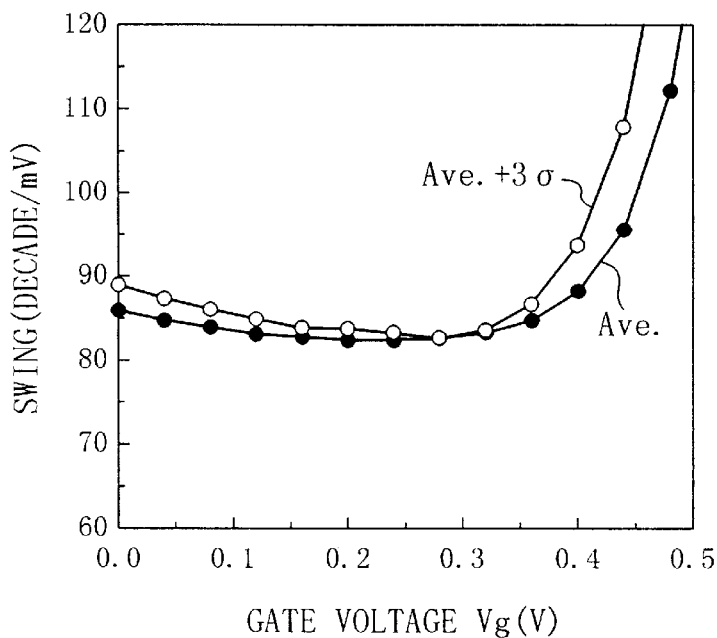
FIG. 8 is a graph for showing a Vg-S parameter in an n-channel transistor obtained by the method of manufacturing a semiconductor device of the first embodiment.
Figure 23:
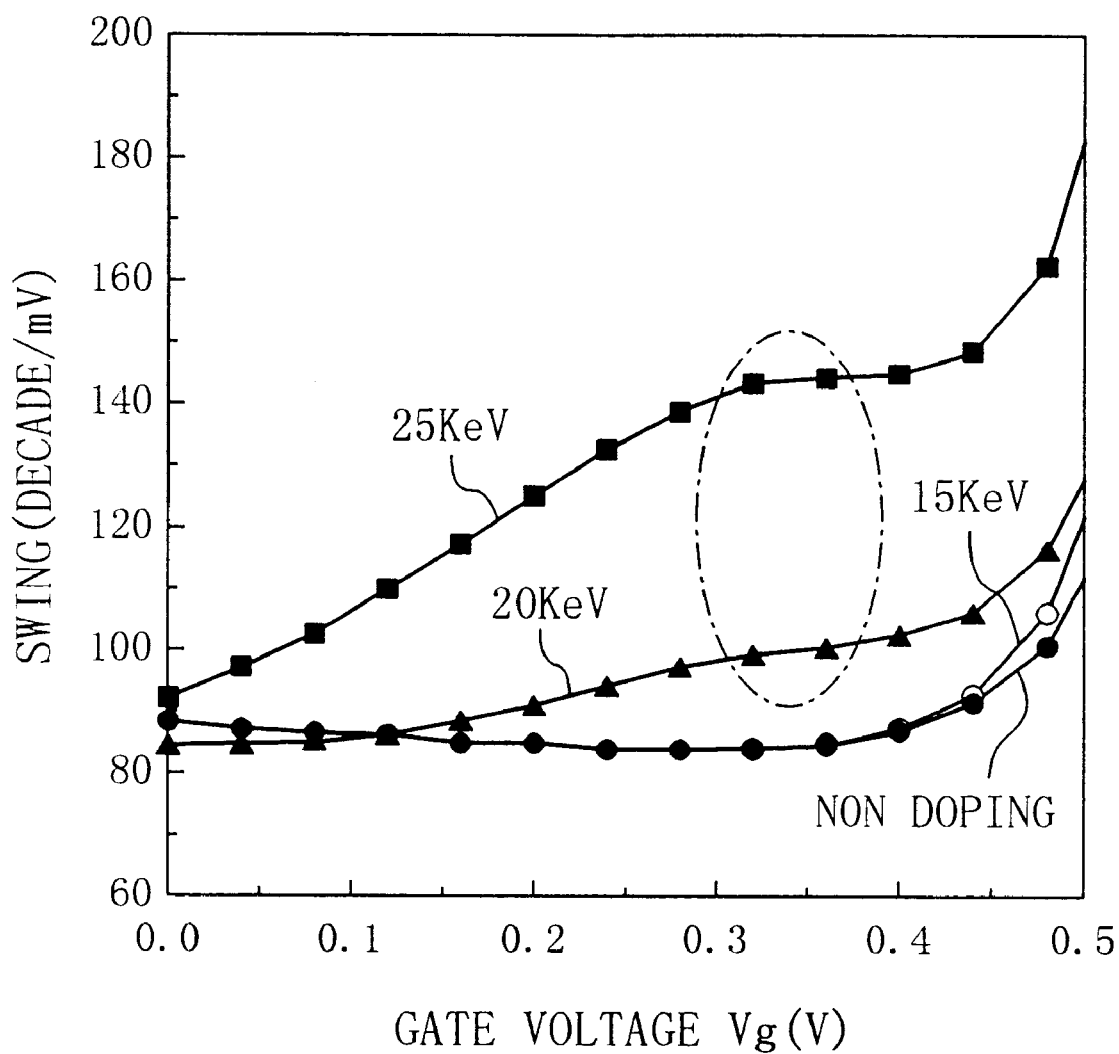
FIG. 23 is a diagram for showing a Vg-S parameter obtained in a transistor manufactured by the conventional method of manufacturing a semiconductor device.
Figure 24:
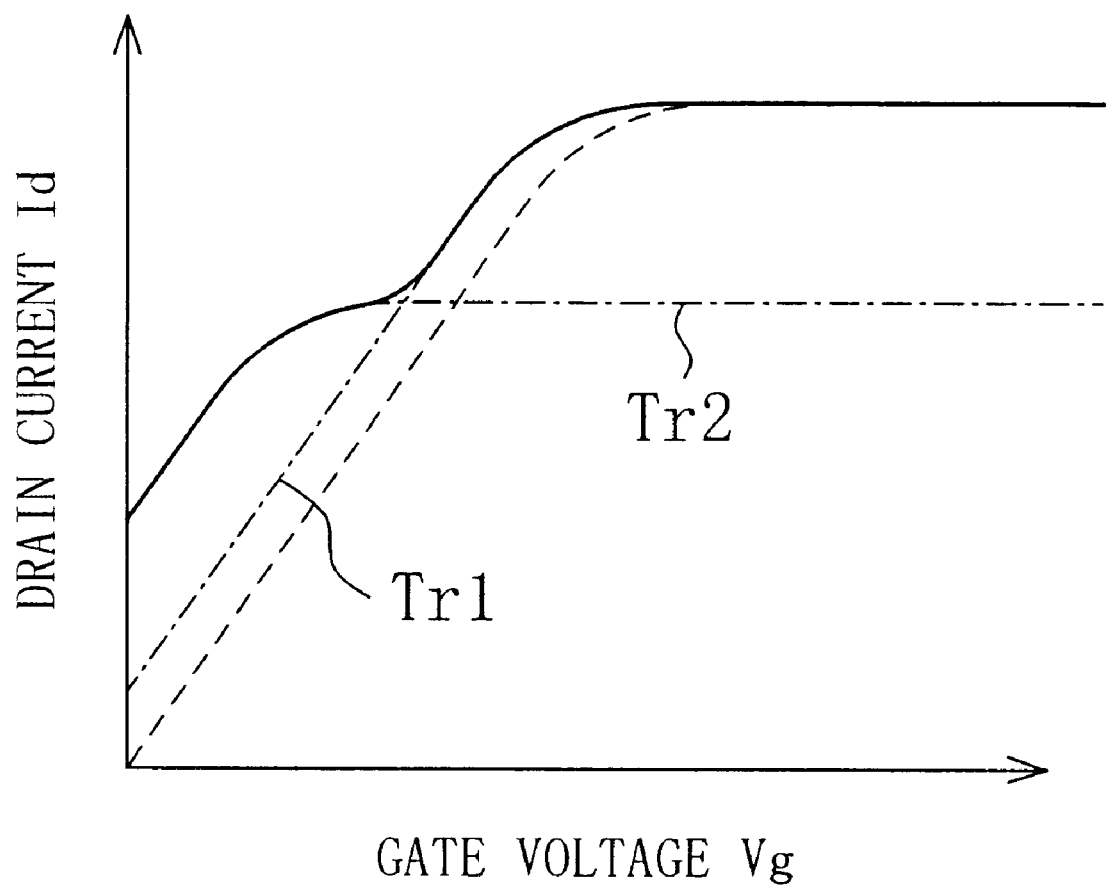
FIG. 24 is a diagram for illustrating a kink phenomenon occurring in a transistor manufactured by the conventional method of manufacturing a semiconductor device.

FIG. 8 is a diagram for showing a Vg-S parameter (swing) characteristic of an n-channel transistor manufactured by forming the amorphous layer 110 by implanting the As ions at the implantation energy of 60 KeV and a dose of 3×10$^{14}$ cm$^{-2}$ through the insulating thin film 109 with a thickness of 30 nm. This characteristic diagram corresponds to the characteristic diagram of FIG. 23 of a conventional transistor. As is understood from comparison between the characteristic diagrams of FIGS. 8 and 23, the swing value is small in the transistor obtained by the first embodiment, and therefore, although the ion implantation is conducted at the implantation energy of 60 KeV, the channeling phenomenon can be prevented so as to prevent the increase of a leakage current caused in an off-state of the transistor. Also, as is obvious from FIG. 8, in a region of the gate voltage Vg smaller than 0.35 V, the swing value can be smaller than approximately 80.

Figure 9:
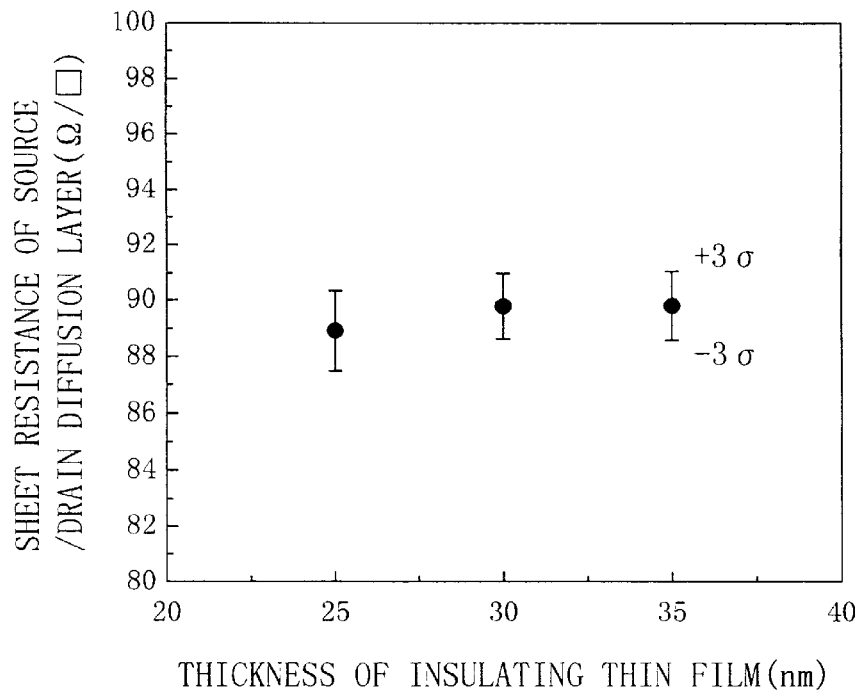
FIG. 9 is a diagram for showing a relationship between a thickness of the insulating thin film in a non-silicide region and a sheet resistance of a source/drain diffusion layer obtained in the method of manufacturing a semiconductor device of the first embodiment.
Figure 10:
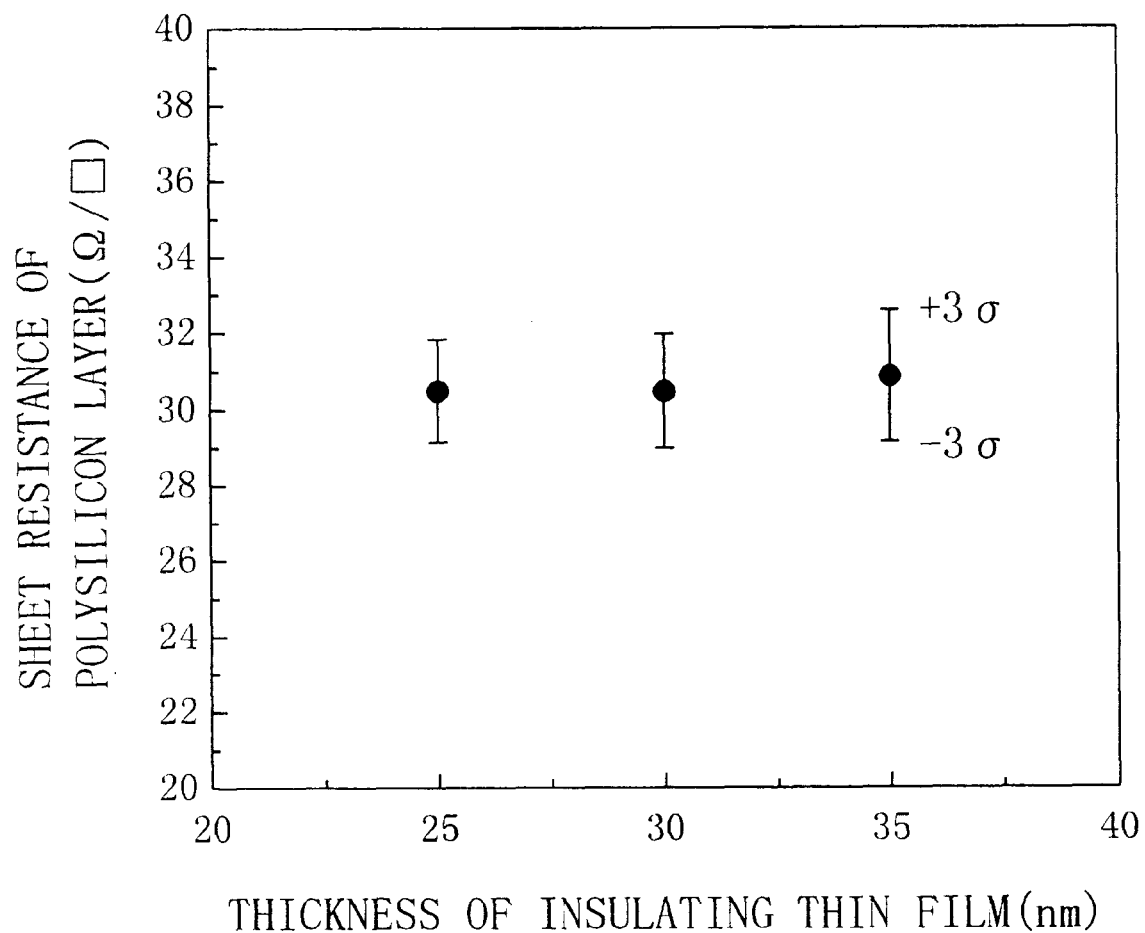
FIG. 10 is a diagram for showing a relationship between a thickness of the insulating thin film in the non-silicide region and a sheet resistance of a polysilicon film obtained in the method of manufacturing a semiconductor device of the first embodiment.

FIGS. 9 and 10 show a relationship between the thickness of the insulating thin film 109 in the non-silicide region and the sheet resistance obtained when the As ions are implanted at the implantation energy of 60 KeV and a dose of 3×10$^{14}$ cm$^{-2}$. FIG. 9 shows the sheet resistance of the source/drain diffusion layer (the second resistance), and FIG. 10 shows the sheet resistance of the polysilicon layer (the first resistance). As described above, the insulating thin film 109 for preventing the channeling phenomenon is used also as a silicidation preventing insulating film for forming the non-silicide region. As is understood from FIG. 9, the source/drain diffusion layer has a sheet resistance of approximately 90 Ω/□, and the polysilicon layer has a sheet resistance of approximately 30 Ω/□. Thus, it is confirmed that a non-silicide resistance is definitely formed in both the layers. Also, in FIGS. 9 and 10, the thickness of the insulating thin film 109 is set at 25 nm, 30 nm or 35 nm, and it is confirmed that the non-silicide resistance can be definitely formed by setting the thickness of the insulating thin film 109 in this range.

As described so far, according to the first embodiment, the sheet resistance of the gate electrode and the source/drain electrode can be decreased as well as the channeling phenomenon can be prevented. In addition, the insulating thin film 109 for preventing the channeling phenomenon can be used also as the silicidation preventing insulating film for forming the non-silicide region.

EMBODIMENT 2

Figure 11:
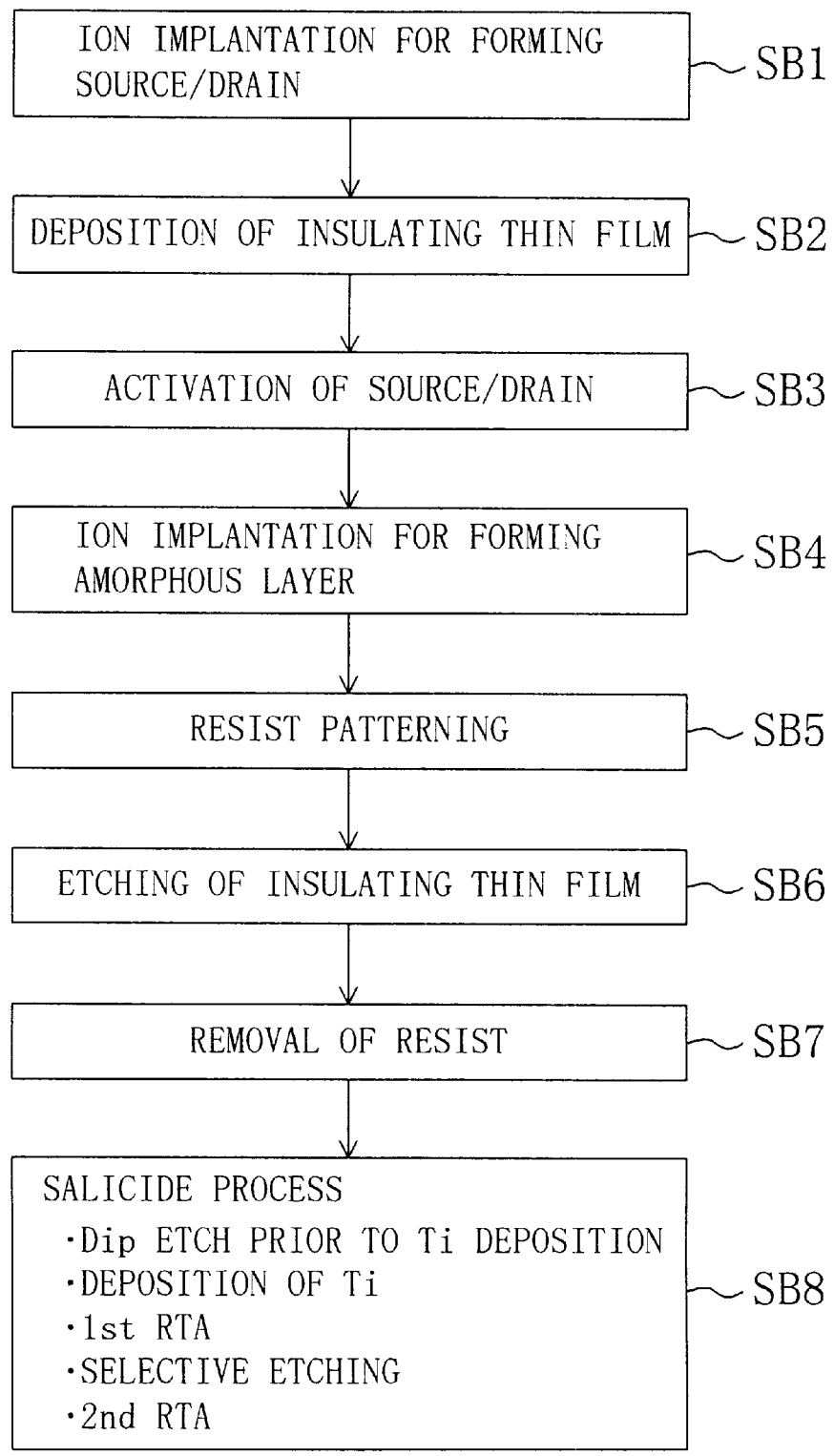
FIG. 11 is a flowchart of a method of manufacturing a semiconductor device according to a second embodiment of the invention.

A method of manufacturing a semiconductor device according to a second embodiment of the invention will now be described with reference to a flowchart of FIG. 11 and procedure sectional views of FIGS. 12(a) through 12(d) and 13(a) through 13(e).

Figure 12A:
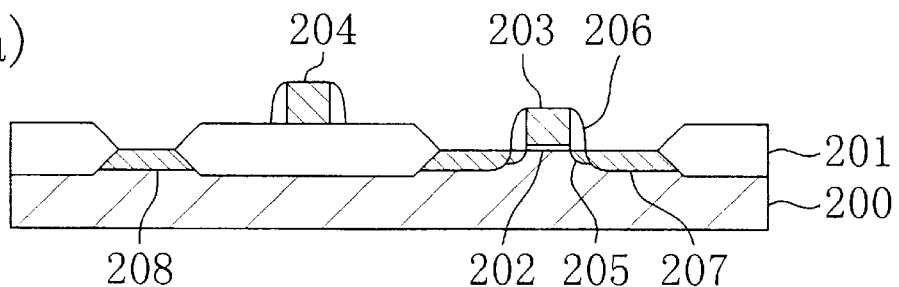
FIGS. 12(a) through 12(d) are sectional views for showing procedures in the method of manufacturing a semiconductor device of the second embodiment.

First, as is shown in FIG. 12(a), after an isolation region 201 and a gate insulating film 202 are formed on a semiconductor substrate 200 of silicon, a first polysilicon film 203 to be used as a gate electrode and a second polysilicon film 204 to be used as a first resistance are formed. Then, after forming a low concentration impurity layer 205 as an LDD diffusion layer and a sidewall 206, impurity ions are implanted by using the first polysilicon film 203 and the sidewall 206 as masks in a step SB1, thereby forming a first high concentration impurity layer 207 to be used as a source/drain region. At this point, a second high concentration impurity layer 208 to be used as a second resistance is simultaneously formed.

Figure 12B:
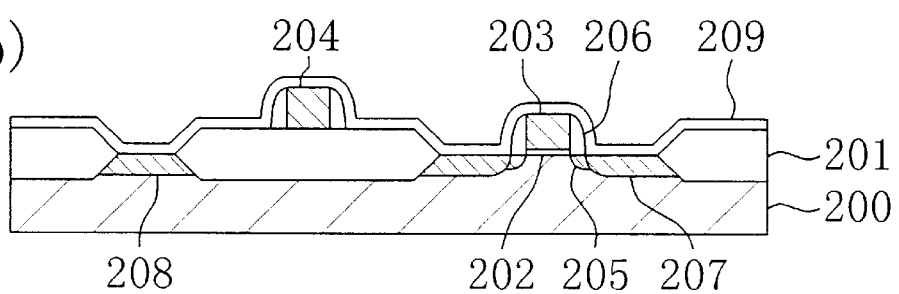

Next, in a step SB2, an insulating thin film 209 of a silicon oxide film with a thickness of 30 nm is deposited on the entire surface of the semiconductor substrate 200 by the CVD as is shown in FIG. 12(b).

Then, in a step SB3, the semiconductor substrate 200 is subjected to a heat treatment at a temperature of approximately 850° C. for 45; minutes in an atmosphere of nitrogen, thereby activating the first high concentration impurity layer 207 to be used as the source/drain region and the second high concentration impurity layer 208 to be used as the second resistance.

Figure 12C:
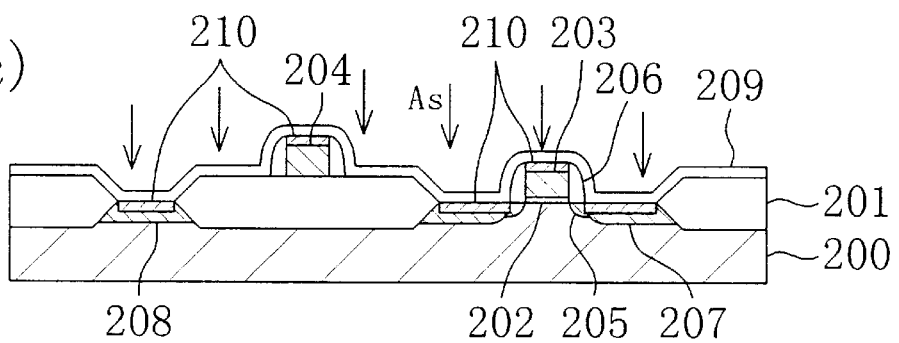

Then, in a step SB4, for example, As ions are implanted at an implantation energy of 60 KeV at a dose of $3 \times 10^4$ cm$^{-2}$ as is shown in FIG. 12(c), thereby forming an amorphous layer 210 on the surfaces of the first and second polysilicon films 203 and 204 and the first and second high concentration impurity layers 207 and 208.

Figure 12D:
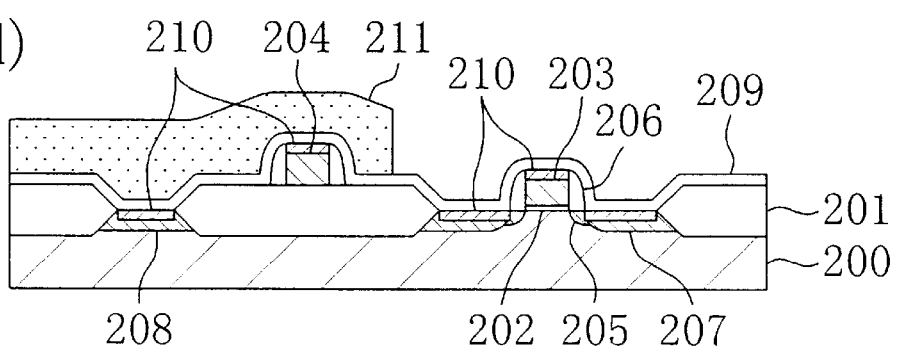
Figure 13A:
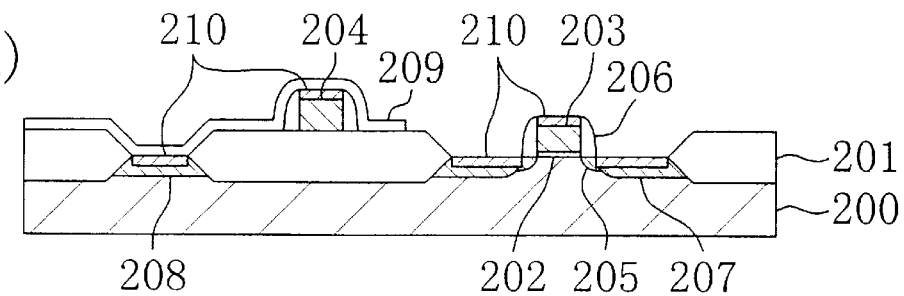
FIGS. 13(a) through 13(e) are sectional views for showing other procedures in the method of manufacturing a semiconductor device of the second embodiment.

Next, in a step SB5, after a resist pattern 211 is formed on a non-silicide region as is shown in FIG. 12(d), the insulating thin film 209 is dry etched by using the resist pattern 211 as a mask in a step SB6. Thus, the insulating thin film 209 is selectively removed in the silicide region with remaining in the non-silicide region as is shown in FIG. 13(a). Thereafter, the resist pattern 211 is removed by using sulfuric acid—hydrogen peroxide in a step SB7.

Subsequently, a salicide process is conducted in a step SB8, which will now be described with reference to FIGS. 13(b) through 13(e).

Figure 13B:
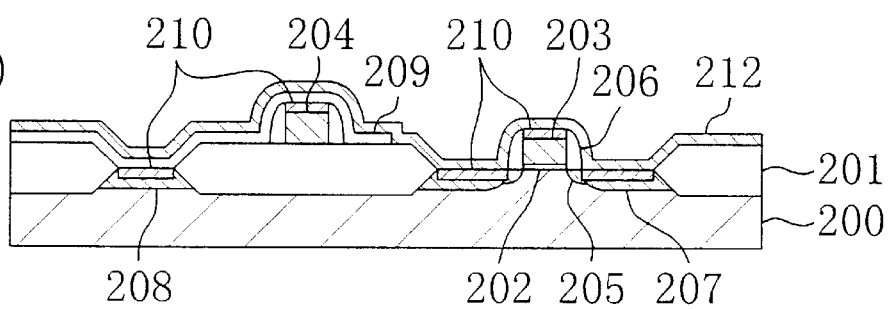

First, after removing a natural oxide film by cleaning the substrate with a diluted HF solution for 10 seconds (the dip etch prior to Ti deposition), a Ti film 212 with a thickness of 40 nm is deposited on the entire surface of the semiconductor substrate 200 by sputtering as is shown in FIG. 13(b).

Figure 13C:
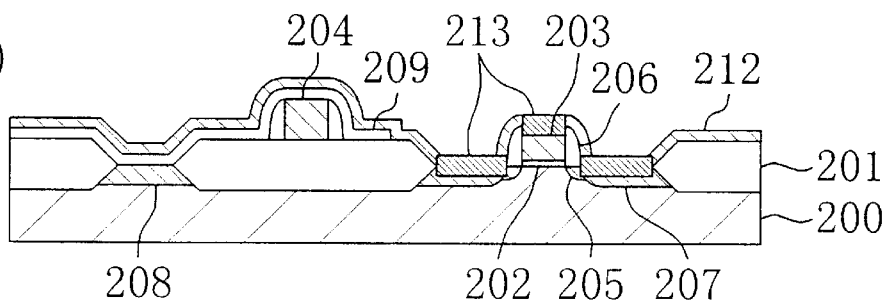

Then, first RTA is conducted at a temperature of approximately 650° C. for 30 seconds in an atmosphere of nitrogen, thereby causing a reaction between the amorphous layer 210 and the Ti film 212 in the silicide region. Thus, a TiSi$_2$ (C49) film 213 having the C49 crystalline structure is formed on the surfaces of the first polysilicon film 203 and the first high concentration impurity layer 207 as is shown in FIG. 13(c).

Figure 13D:
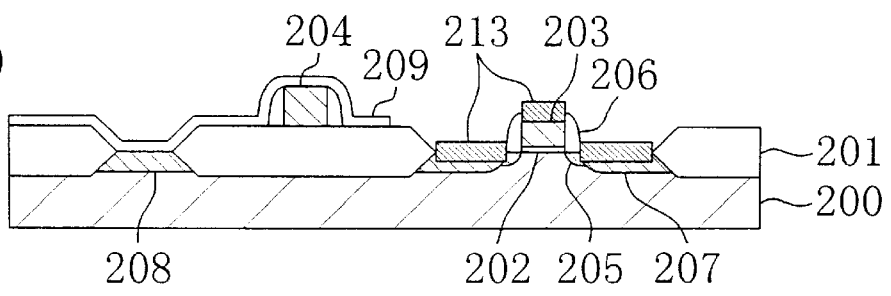
Figure 13E:
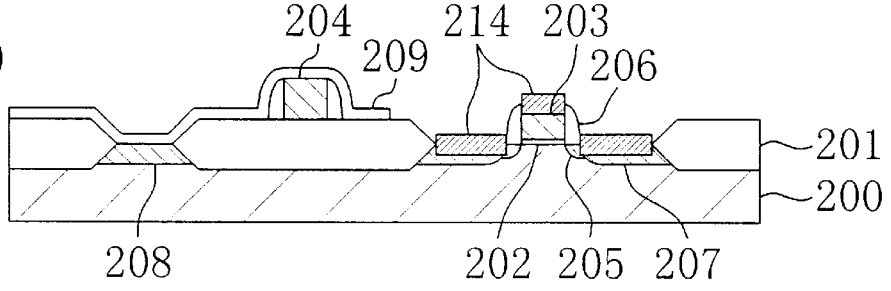

Next, as is shown in FIG. 13(d), after the remaining Ti film 212 is selectively removed by using an etching solution such as sulfuric acid—hydrogen peroxide and ammonia—hydrogen peroxide, second RTA is conducted at a temperature of approximately 825° C. for 10 seconds in an atmosphere of nitrogen. Thus, the TiSi$_2$ (C49) film 213 is changed into a low-resistance TiSi$_2$ (C54) film 214 having the C54 crystalline structure as is shown in FIG. 13(e). In this manner, the gate electrode is formed out of the first polysilicon film 203 and the TiSi$_2$ (C54) film 214, and a source/drain electrode is formed out of the TiSi$_2$ (C54) film 214 on the first high concentration impurity layer 207.

According to the second embodiment, since the As ions are implanted through the insulating thin film 209, the sheet resistance of the gate electrode and the source/drain electrode can be both decreased as well as the channeling phenomenon of the implanted ions can be prevented. In addition, the insulating thin film 209 for preventing the channeling phenomenon can be also used as a silicidation preventing insulating film for forming the non-silicide region.

EMBODIMENT 3

Figure 14:
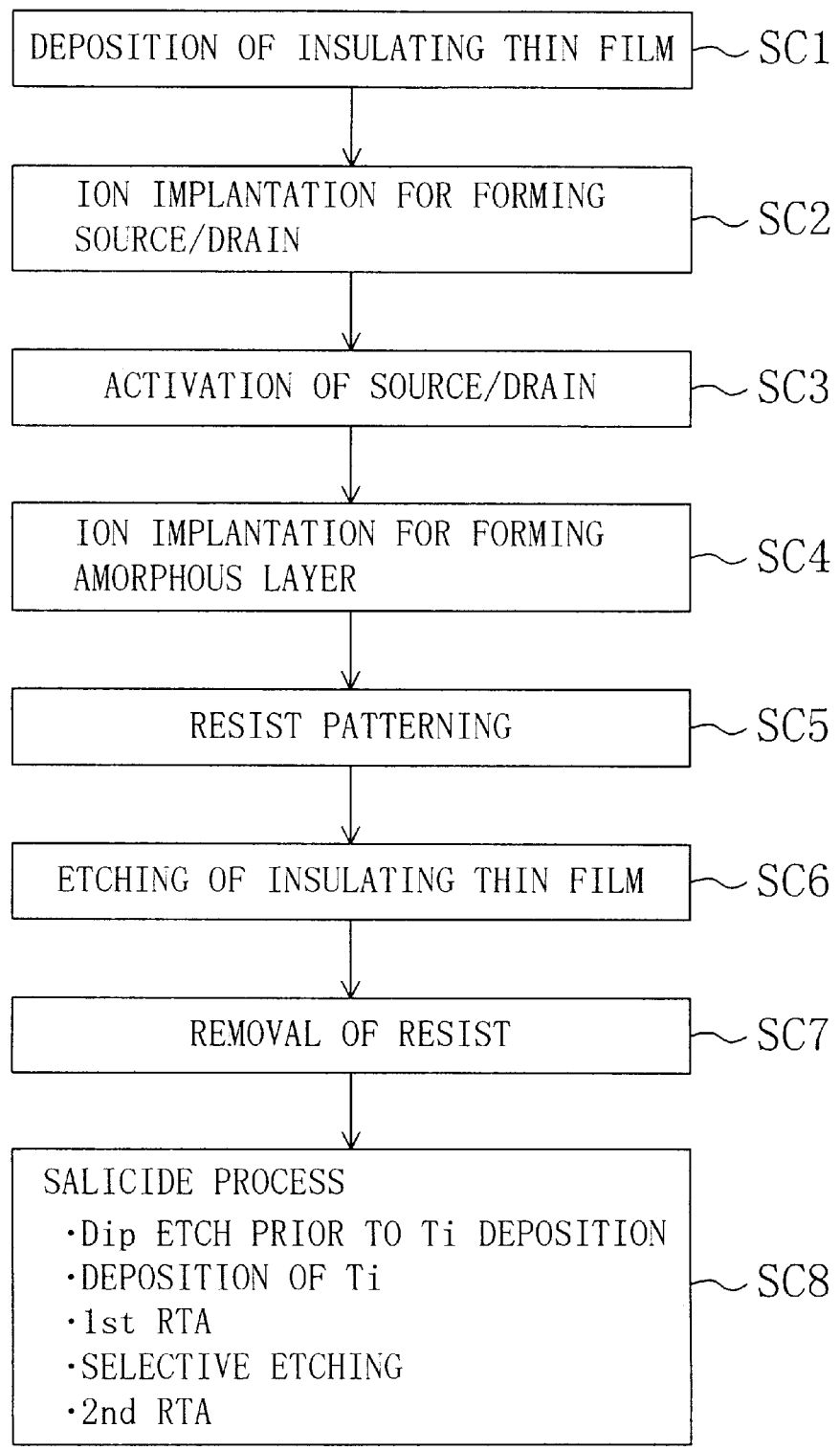
FIG. 14 is a flowchart for showing a method of manufacturing a semiconductor device according to a third embodiment of the invention.

A method of manufacturing a semiconductor device according to a third embodiment of the invention will now be described with reference to a flowchart of FIG. 14 and procedure sectional views of FIGS. 15(a) through 15(d) and 16(a) through 16(e).

Figure 15A:
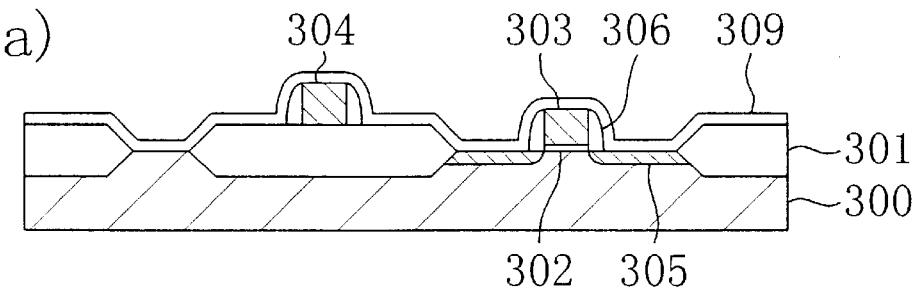
FIGS. 15(a) through 15(d) are sectional views for showing procedures in the method of manufacturing a semiconductor device of the third embodiment.

First, as is shown in FIG. 15(a), after an isolation region 301 and a gate insulating film 302 are formed on a semiconductor substrate 300 of silicon, a first polysilicon film 303 to be used as a gate electrode and a second polysilicon film 304 to be used as a first resistance are formed. Thereafter, a low concentration impurity layer 305 as an LDD diffusion layer and a sidewall 306 are formed.

Figure 15B:
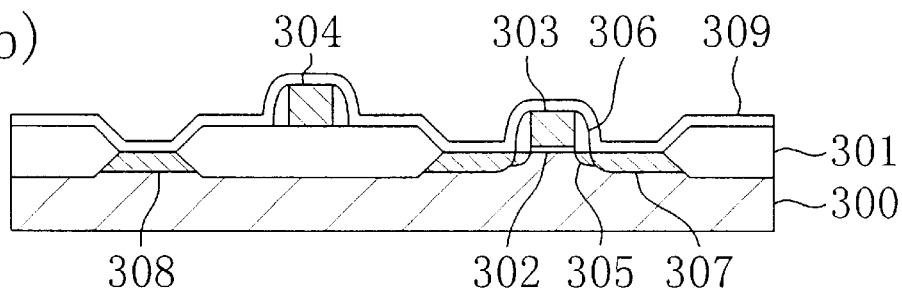

Next, in a step SC1, an insulating thin film 309 of a silicon oxide film with a thickness of 30 nm is deposited by the CVD on the entire surface of the semiconductor substrate 300 as is shown in FIG. 15(b). In step SC2, impurity ions are implanted by using the first polysilicon film 303 and the sidewall 306 as masks, thereby forming a first high concentration impurity layer 307 to be used as a source/drain region. At this point, a second high concentration impurity layer 308 to be used as a second resistance is simultaneously formed. Furthermore, since the impurity ion implantation is conducted through the insulating thin film 309 in the third embodiment, the implantation energy for the impurity ions is larger than those in the first and second embodiments.

Next, in a step SC3, the semiconductor substrate 300 is subjected to a heat treatment at a temperature of approximately 850° C. for 45 minutes in an atmosphere of nitrogen, thereby activating the first high concentration impurity layer 307 to be used as the source/drain region and the second high concentration impurity layer 308 to be used as the second resistance.

Figure 15C:
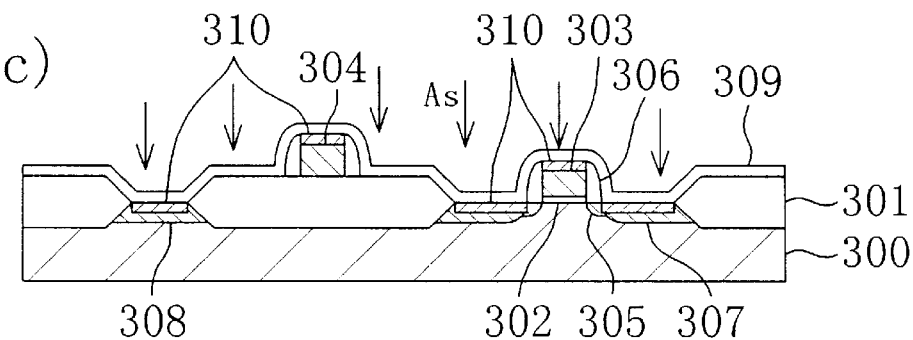

Then, in a step SC4, for example, As ions are implanted at the implantation energy of 60 KeV at a dose of $3 \times 10^{14}$ $cm^{-2}$ as is shown in FIG. 15(c), thereby forming an amorphous layer 310 on the surfaces of the first and second polysilicon films 303 and 304 and the first and second high concentration impurity layers 307 and 308.

Figure 15D:
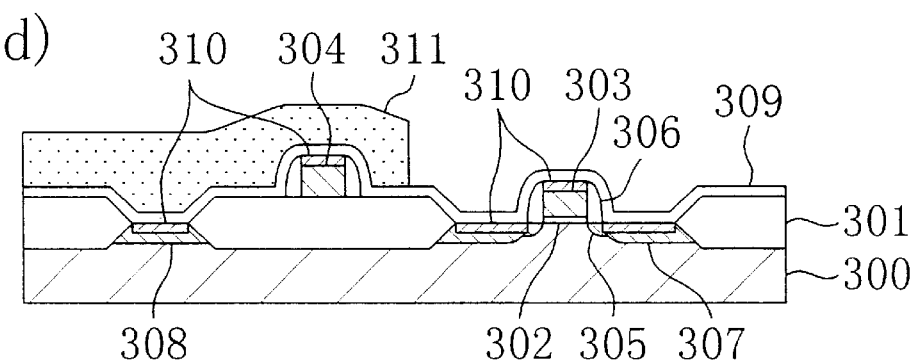
Figure 16A:
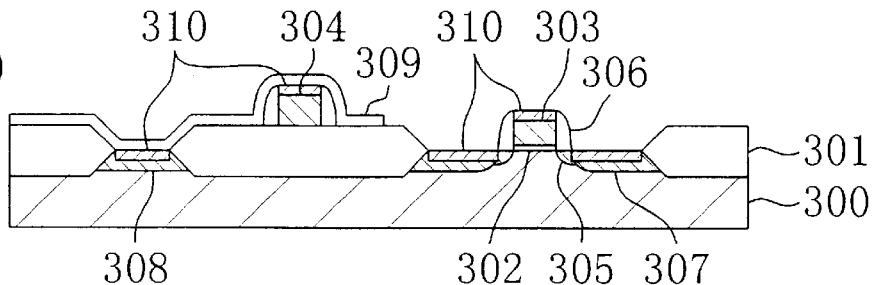
FIGS. 16(a) through 16(e) are sectional views for showing other procedures in the method of manufacturing a semiconductor device of the third embodiment.

Next, in a step SC5, a resist pattern 311 is formed on a non-silicide region as is shown in FIG. 15(d), and in a step SC6, the insulating thin film 309 is dry etched by using the resist pattern 311 as a mask. Thus, the insulating thin film 309 is selectively removed in a silicide region with remaining in the non-silicide region as is shown in FIG. 16(a). Thereafter, in a step SC7, the resist pattern 311 is removed by using sulfuric acid—hydrogen peroxide.

Then, in a step SC8, a salicide process is conducted, which will now be described with reference to FIGS. 16(b) through 16(e).

Figure 16B:
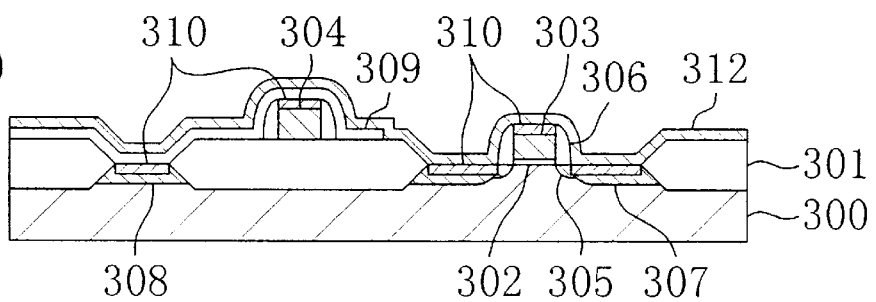

First, after removing a natural oxide film by cleaning the substrate with a diluted HF solution for 10 seconds (the dip etch prior to Ti deposition), a Ti film 312 with a thickness of 40 nm is deposited by sputtering on the entire surface of the semiconductor substrate 300 as is shown in FIG. 16(b).

Figure 16C:
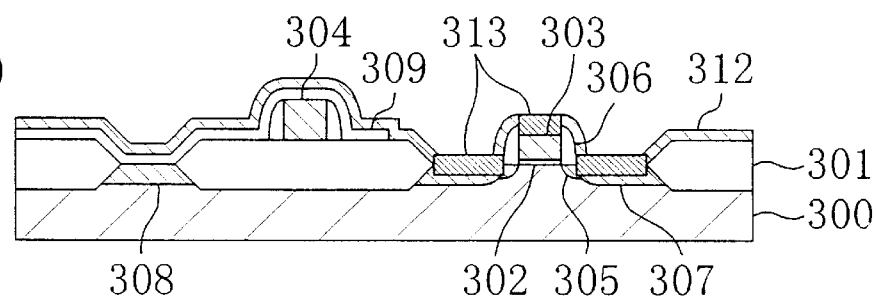

Then, first RTA is conducted at a temperature of approximately 650° C. for 30 seconds in an atmosphere of nitrogen, thereby causing a reaction between the amorphous layer 310 and the Ti film 312 in the silicide region. Thus, a $TiSi_2$ (C49) film 313 having the C49 crystalline structure is formed on the surfaces of the first polysilicon film 303 and the first high concentration impurity layer 307 as is shown in FIG. 16(c).

Figure 16D:
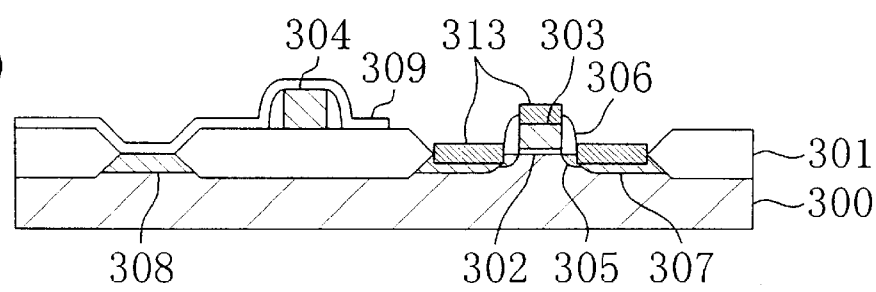
Figure 16E:
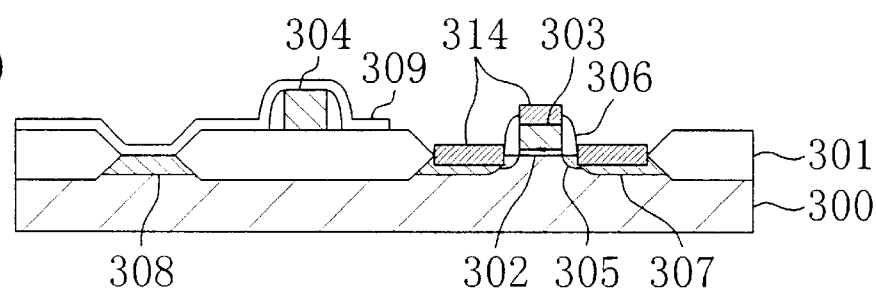

Next, as is shown in FIG. 16(d), the remaining Ti film 312 is selectively removed by using an etching solution such as sulfuric acid—hydrogen peroxide and ammonia—hydrogen peroxide. Thereafter, second RTA is conducted at a temperature of approximately 825° C. for 10 seconds in an atmosphere of nitrogen. Thus, the $TiSi_2$ (C49) film 313 is changed into a low-resistance $TiSi_2$ (C54) film 314 having the C54 crystalline structure as is shown in FIG. 16(e). In this manner, the gate electrode is formed out of the first polysilicon film 303 and the $TiSi_2$ (C54) film 314 and a source/drain electrode is formed out of the $TiSi_2$ (C54) film 314 on the first high concentration impurity layer 307.

According to the third embodiment, since the As ions are implanted through the insulating thin film 309, the sheet resistance of the gate electrode and the source/drain electrode can be both decreased as well as the channeling phenomenon of the implanted ions can be prevented. In addition, the insulating thin film 309 for preventing the channeling phenomenon can be also used as a silicidation preventing insulating film for forming the non-silicide region.

EMBODIMENT 4

Figure 17:
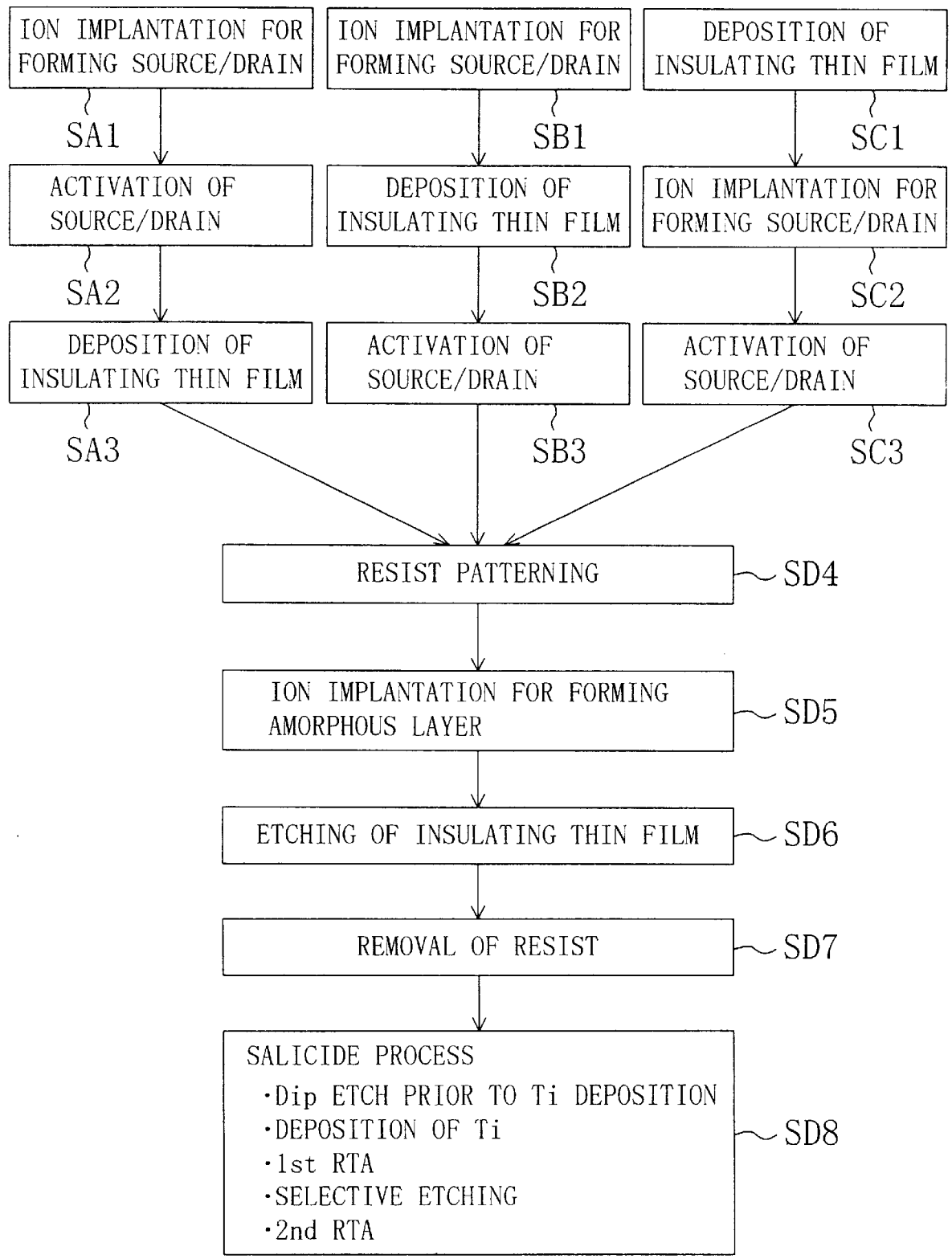
FIG. 17 is a flowchart of a method of manufacturing a semiconductor device according to a fourth embodiment of the invention.

A method of manufacturing a semiconductor device according to a fourth embodiment of the invention will now be described with reference to a flowchart of FIG. 17 and procedure sectional views of FIGS. 18(a) through 18(d) and 19(a) through 19(e). As procedures before forming a resist pattern 411 in the method of the fourth embodiment, any of the steps SA1 through SA3 of the first embodiment, the steps SB1 through SB3 of the second embodiment, and the steps SC1 through SC3 of the third embodiment can be adopted. Herein, description will given by assuming that the steps SA1 through SA3 of the first embodiment are adopted.

Figure 18A:
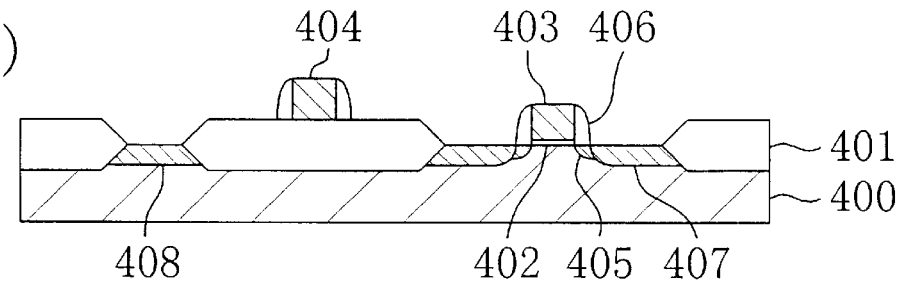
FIGS. 18(a) through 18(d) are sectional views for showing procedures in the method of manufacturing a semiconductor device of the fourth embodiment.
Figure 18B:
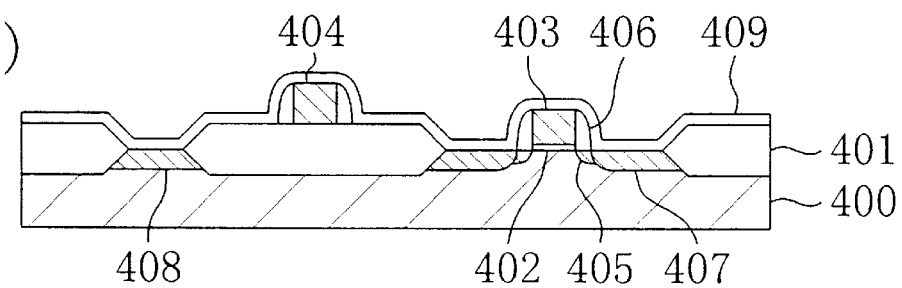

First, as is shown in FIG. 18(a), on a semiconductor substrate 400 of silicon, an isolation region 401, a gate insulating film 402, a first polysilicon film 403 to be used as a gate electrode, a second polysilicon film 404 to be used as a first resistance, a low concentration impurity layer 405 as an LDD diffusion layer and a sidewall 406 are successively formed. Thereafter, in a step SA1, a first high concentration impurity layer 407 to be used as a source/drain region and a second high concentration impurity layer 408 to be used as a second resistance are formed.

Next, in a step SA2, the semiconductor substrate 400 is subjected to a heat treatment at a temperature of approximately 850° C. for 45 minutes in an atmosphere of nitrogen, thereby activating the first high concentration impurity layer 407 to be used as the source/drain region and the second high concentration impurity layer 408 to be used as the second resistance. Then, in a step SA3, an insulating thin film 409 of a silicon oxide film with a thickness of 30 nm is deposited on the entire surface of the semiconductor substrate 400.

Figure 18C:
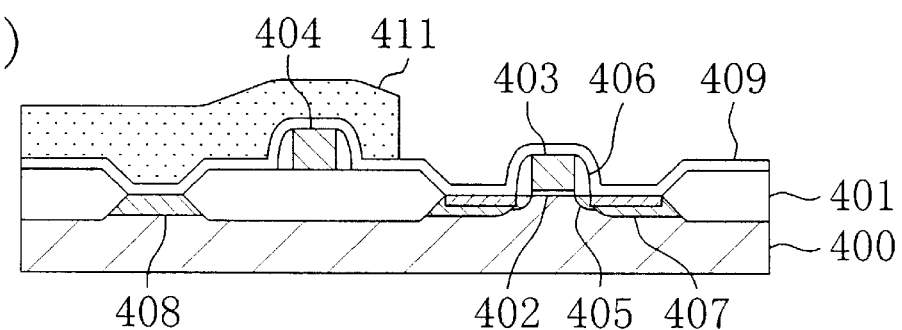
Figure 18D:
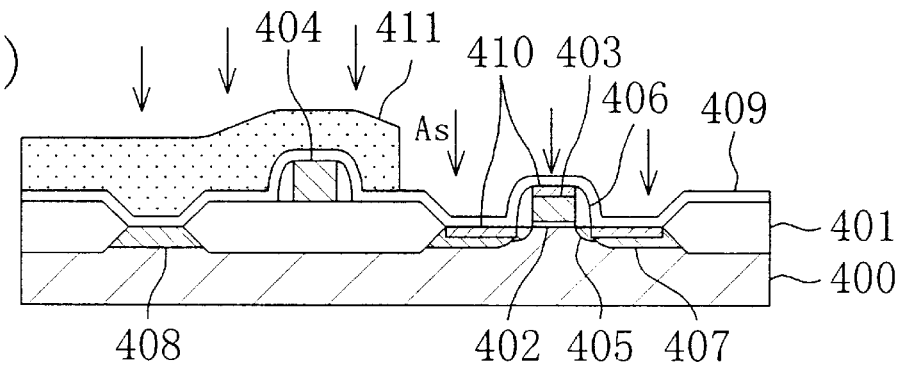

Next, in a step SD4, a resist pattern 411 is formed on a non-silicide region as is shown in FIG. 18(c), and in a step SD5, for example, As ions are implanted at an implantation energy of 60 KeV at a dose of $3 \times 10^{14}$ $cm^{-2}$ as is shown in FIG. 18(d). Thus, an amorphous layer 410 is formed on the surfaces of the first polysilicon film 403 and the first high concentration impurity layer 407.

Figure 19A:
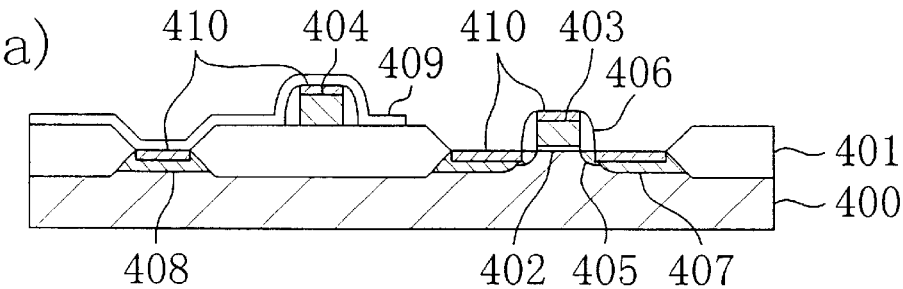
FIGS. 19(a) through 19(e) are sectional views for showing other procedures in the method of manufacturing a semiconductor device of the fourth embodiment.

Then, in a step SD6, the insulating thin film 409 is dry etched by using the resist pattern 411 as a mask, thereby selectively removing the insulating thin film 409 in a suicide region with remaining in the non-silicide region as is shown in FIG. 19(a). Thereafter, in a step SD7, the resist pattern 411 is removed by using sulfuric acid—hydrogen peroxide.

Next, in a step SD8, a salicide process is conducted, which will now be described with reference to FIGS. 19(b) through 19(e).

Figure 19B:
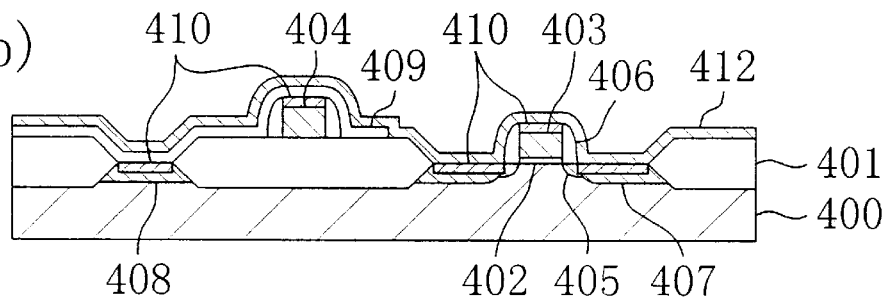

First, after removing a natural oxide film by cleaning the substrate with a diluted HF solution for 10 seconds (the dip etch prior to Ti deposition), a Ti film 412 with a thickness of 40 nm is deposited by sputtering on the entire surface of the semiconductor substrate 400 as is shown in FIG. 19(b).

Figure 19C:
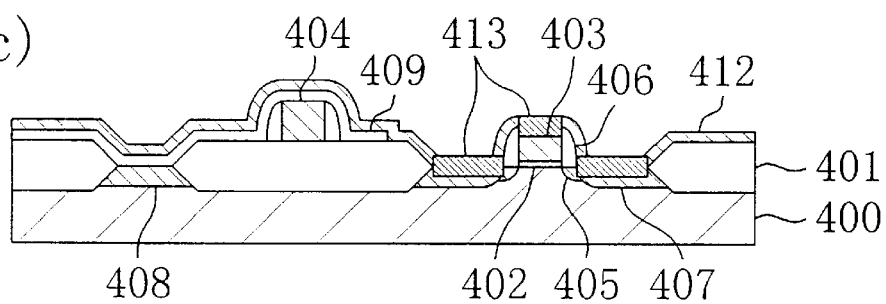

Then, first RTA is conducted at a temperature of approximately 650° C. for 30 seconds in an atmosphere of nitrogen, thereby causing a reaction between the amorphous layer 410 and the Ti film 412 in the silicide region. Thus, a $TiSi_2$ (C49) film 413 having the C49 crystalline structure is formed on the surfaces of the first polysilicon film 403 and the first high concentration impurity layer 407 as is shown in FIG. 19(c).

Figure 19D:
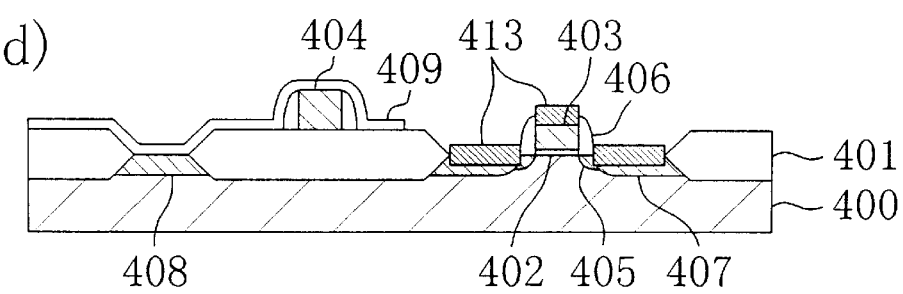
Figure 19E:
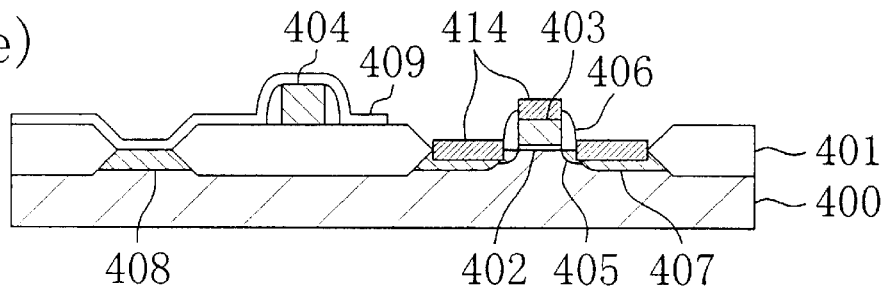
Figure 20A:
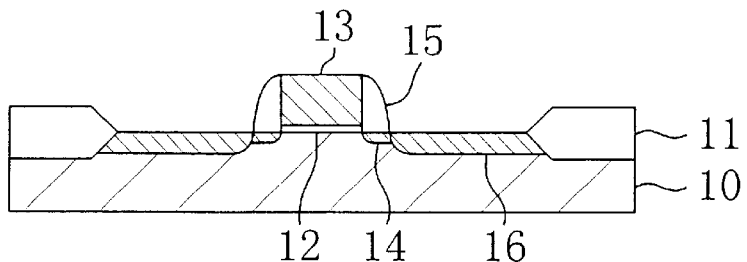
FIGS. 20(a) through 20(f) are sectional views for showing procedures in a conventional method of manufacturing a semiconductor device.
Figure 20B:
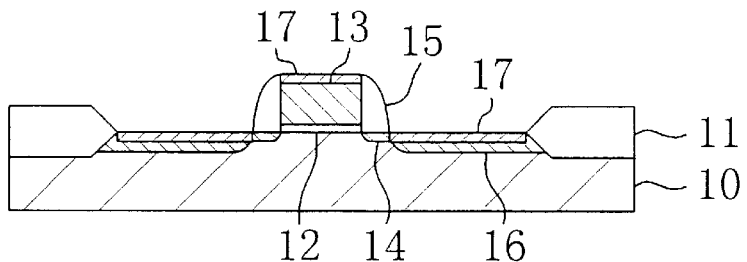
Figure 20C:
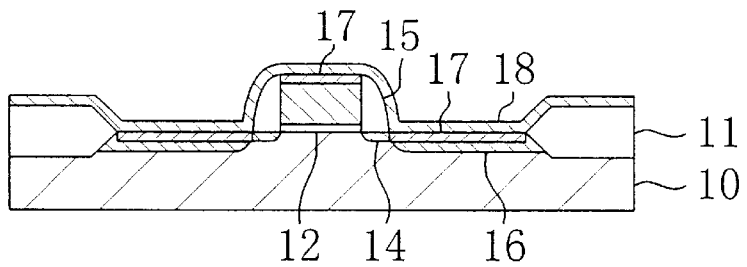
Figure 20D:
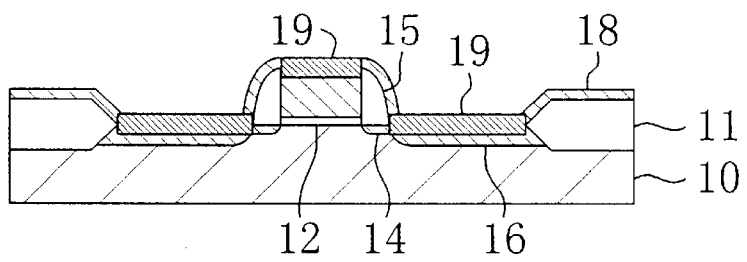
Figure 20E:
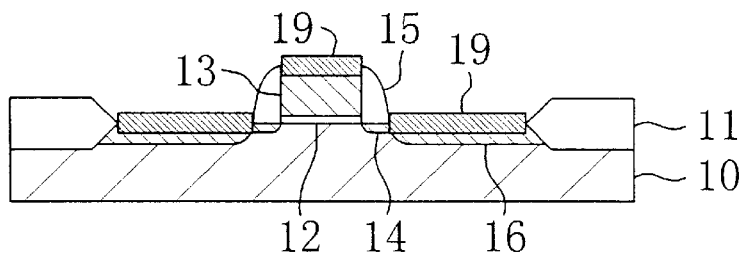
Figure 20F:
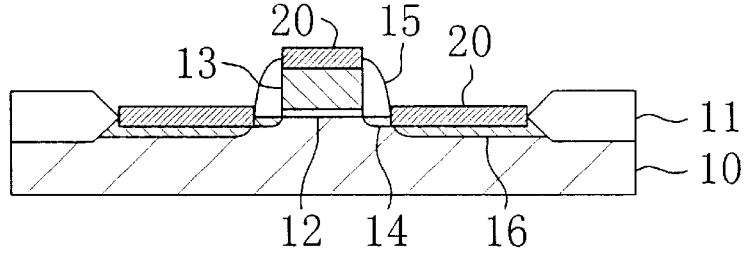
Figure 21:
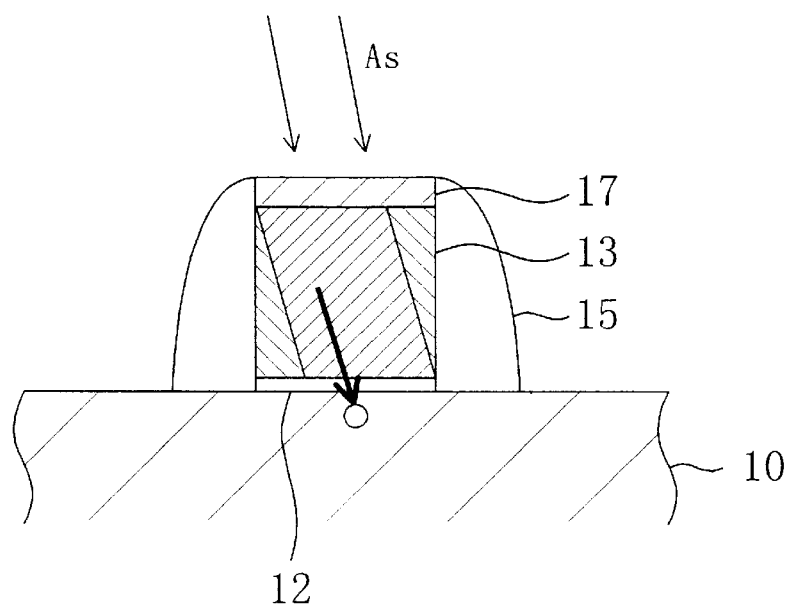
FIG. 21 is a sectional view for schematically showing formation of an amorphous layer by implanting As ions into a polysilicon film in the conventional method of manufacturing a semiconductor device, for illustrating a state where the channeling phenomenon is caused.
Figure 22:
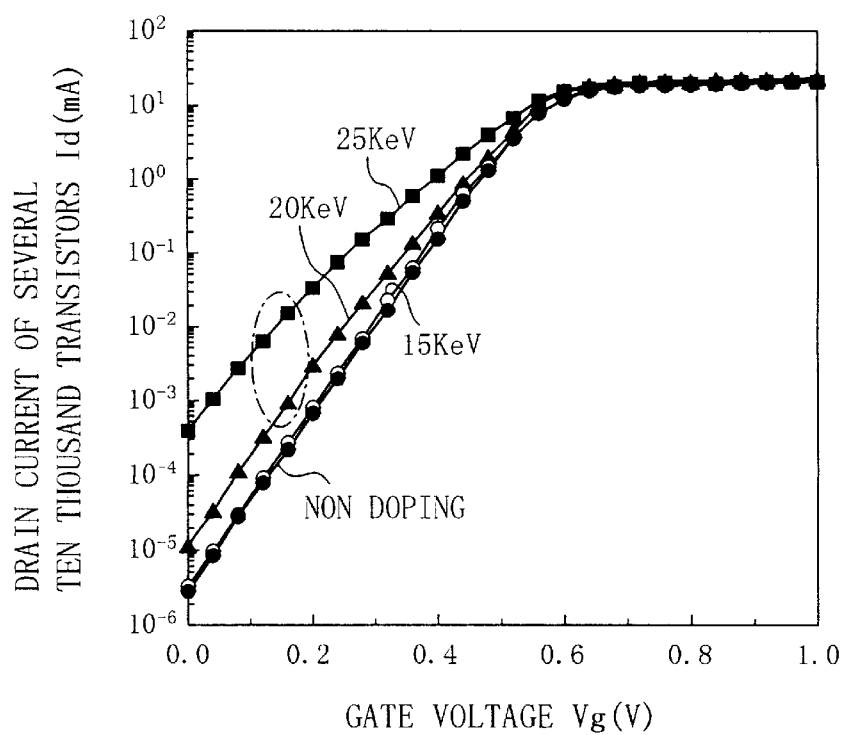
FIG. 22 is a graph for showing a transistor characteristic (Vg-Id characteristic) attained when the amorphous layer is formed through implantation of As ions with an implantation energy varied in the conventional method of manufacturing a semiconductor device.

Next, as is shown in FIG. 19(d), after the remaining Ti film 412 is selectively removed by using an etching solution such as sulfuric acid—hydrogen peroxide and ammonia—hydrogen peroxide, second RTA is conducted at a temperature of approximately 825° C. for 10 seconds in an atmosphere of nitrogen. Thus, the $TiSi_2$ (C49) film 413 is changed into a low-resistance $TiSi_2$ (C54) film 414 having the C54 crystalline structure as is shown in FIG. 19(e). In this manner, the gate electrode is formed out of the first polysilicon film 403 and the $TiSi_2$ (C54) film 414 and a source/drain electrode is formed out of the $TiSi_2$ (C54) film 414 on the first high concentration impurity layer 407.

According to the fourth embodiment, since the As ions are implanted through the insulating thin film 409, the channeling phenomenon of the implanted ions can be prevented as well as the sheet resistance of the gate electrode and the source/drain electrode can be both decreased. In addition, the insulating thin film 409 for preventing the channeling phenomenon can be also used as a silicidation preventing insulating film for forming the non-silicide region.

Moreover, since the As ions are implanted through the insulating thin film 409 after forming the resist pattern 411 in the fourth embodiment, the amorphous layer 410 is not formed on the surfaces of the second polysilicon film 404 and the second high concentration impurity layer 408 in the non-silicide region. Accordingly, the thus obtained resistances can be stabilized.

In each of the first through fourth embodiments, the silicon oxide film is used as the insulating thin film, but the silicon oxide film can be replaced with a silicon nitride film or another insulating film, or alternatively, a multilayer insulating film including, for example, a silicon oxide film and a silicon nitride film can be used instead.

In each of the first through fourth embodiments, the Ti film is formed as a metallic film for forming the silicide layer, but the Ti film can be replaced with another silicidation material film such as a Co film, a Ni film and a Pt film. Even when such another silicidation material film is used, metal silicide can be definitely formed on the surface of the polysilicon film.

Furthermore, in each of the first through fourth embodiments, the As ions are used as impurity ions for forming the amorphous layer, but the As ions can be replaced with Ge ions, Si ions, P ions or $BF_2$ ions. Even when any of these ions are used instead, an amorphous layer can be definitely formed on the surface of the polysilicon film.

What is claimed is:

1. A method of manufacturing a semiconductor device comprising:

a polysilicon film forming step of forming a polysilicon film to be used as a gate electrode on a semiconductor substrate of silicon;

an insulating thin film depositing step of depositing an insulating thin film on said semiconductor substrate on which said polysilicon film is formed;

an ion implanting step of forming an amorphous layer in a surface portion of said polysilicon film by implanting impurity ions into said polysilicon film through said insulating thin film;

an insulating thin film removing step of selectively removing said insulating thin film so as to remove a first region of said insulating thin film existing on said polysilicon film to expose said amorphous layer and to remain a second region of said insulating thin film existing in a non-silicide region over said semiconductor substrate, in which no silicide layer is to be formed; and a silicide layer forming step of forming a metal silicide layer on the surface of said polysilicon film by depositing a metal film on said amorphous layer and causing a reaction between said amorphous layer and said metal film through annealing.

2. The method of manufacturing a semiconductor device of claim 1, wherein said ion implanting step includes a step of implanting said impurity ions under a condition satisfying $R_p-T>3$ nm, wherein $R_p$ indicates a range of said impurity ions from a surface of said insulating thin film and T indicates a thickness of said insulating thin film.

3. The method of manufacturing a semiconductor substrate of claim 1, wherein said insulating thin film depositing step includes a step of depositing said insulating thin film on an impurity diffusion layer formed on said semiconductor substrate to be used as a source/drain region, said ion implanting step includes a step of forming an amorphous layer on a surface of said impurity diffusion layer by implanting said impurity ions into said impurity diffusion layer through said insulating thin film, and said silicide layer forming step includes a step of forming a metal silicide layer to be used as a source/drain electrode on a surface of said impurity diffusion layer through annealing after depositing said metal film also on said amorphous layer formed on the surface of said impurity diffusion layer.

4. The method of manufacturing a semiconductor device of claim 1, further comprising, between said insulating thin film depositing step and said ion implanting step, a step of activating an impurity diffusion layer formed on said semiconductor substrate to be used as a source/drain region through a heat treatment.

5. The method of manufacturing a semiconductor device of claim 1, further comprising, between said insulating thin film depositing step and said ion implanting step:

a step of forming an impurity diffusion layer to be used as a source/drain region by implanting impurity ions into said semiconductor substrate; and a step of activating said impurity diffusion layer through a heat treatment.

6. The method of manufacturing a semiconductor device of claim 1, further comprising, between said insulating thin film depositing step and said ion implanting step, a step of forming a resist pattern on said non-silicide region over said semiconductor substrate, wherein said insulating thin film removing step includes a step of etching said insulating thin film with said resist pattern used as a mask.

7. The method of manufacturing a semiconductor device of claim 1, wherein said insulating thin film deposited in said insulating thin film depositing step has a thickness ranging between 5 nm and 50 nm.

8. The method of manufacturing a semiconductor device of claim 1, wherein said impurity ions implanted in said ion implanting step are As ions, Ge ions, Si ions, P ions or $BF_2$ ions.

9. The method of manufacturing a semiconductor device of claim 1, wherein said metal film deposited in said silicide layer forming step is a Ti film, a Co film, a Ni film or a Pt film.

* * * * *